United States Patent
Park et al.

(10) Patent No.: US 7,893,718 B2
(45) Date of Patent: Feb. 22, 2011

(54) HIGH-SPEED MULTIPLEXER AND SEMICONDUCTOR DEVICE INCLUDING THE SAME

(75) Inventors: Sung Bae Park, Gyeonggi-do (KR); Gun Ok Jung, Gyeonggi-do (KR); Young Min Shin, Seoul (KR); Hoi Jin Lee, Seoul (KR); Chang Jun Choi, Gyeonggi-do (KR); Min Su Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/540,465

(22) Filed: Aug. 13, 2009

(65) Prior Publication Data

US 2010/0039146 A1    Feb. 18, 2010

Related U.S. Application Data

(60) Provisional application No. 61/088,577, filed on Aug. 13, 2008, provisional application No. 61/117,864, filed on Nov. 25, 2008.

(51) Int. Cl.
 *H03K 19/094* (2006.01)
(52) U.S. Cl. .......................................... 326/83; 326/87
(58) Field of Classification Search .............. 326/83–87, 326/112, 113
See application file for complete search history.

(56) References Cited

U.S. PATENT DOCUMENTS

| 5,420,529 | A | | 5/1995 | Guay et al. |
| 5,969,543 | A | * | 10/1999 | Erickson et al. ................ 326/83 |
| 6,236,245 | B1 | * | 5/2001 | Papaliolios ................. 327/108 |
| 7,129,755 | B2 | | 10/2006 | Campbell |

FOREIGN PATENT DOCUMENTS

KR    1020010047174 A    6/2001

* cited by examiner

*Primary Examiner*—Don P Le
(74) *Attorney, Agent, or Firm*—Myers Bigel Sibley & Sajovec

(57) ABSTRACT

High speed multiplexers include a first N-to-1 selection circuit, where N is an integer greater than one, a second N-to-1 selection circuit and an output driver. The first N-to-1 selection circuit is configured to route a true or complementary version of a selected first input signal (from amongst N input signals) to an output thereof in response to a first multi-bit selection signal, where N is an integer greater than one. The second N-to-1 selection circuit is configured to route a true or complementary version of the selected first input signal to an output thereof in response to a second multi-bit selection signal. The output driver includes a pull-up circuit, which is responsive to a signal generated at the output of the first N-to-1 selection circuit, and a pull-down circuit, which is responsive to a signal generated at the output of the second N-to-1 selection circuit.

38 Claims, 23 Drawing Sheets

HIGH-SPEED MULTIPLEXER AND SEMICONDUCTOR DEVICE INCLUDING THE SAME

REFERENCE TO PRIORITY APPLICATIONS

This application claims priority from U.S. Provisional Application No. 61/088,577, filed Aug. 13, 2008 and 61/117,864, filed Nov. 25, 2008, the contents of which are hereby incorporated herein by reference.

FIELD OF THE INVENTION

The present invention relates to integrated circuit devices and, more particularly, to multiplexer circuits.

BACKGROUND

A central processing unit (CPU) or a digital signal processor (DSP) needs to process data at high speed. The CPU or DSP for processing data at high speed can include a multiplexer. The data processing speed of a multiplexer can significantly affect the data processing speed of the CPU or DSP. Accordingly, to manifest a CPU or DSP that operates at high speed, the data processing speed of the multiplexer should be high.

SUMMARY

Integrated circuit devices according to embodiments of the present invention include high speed multiplexers. Some of these multiplexers include a first N-to-1 selection circuit, where N is an integer greater than one, a second N-to-1 selection circuit and an output driver. The first N-to-1 selection circuit is configured to route a true or complementary version of a selected first input signal (from amongst N input signals) to an output thereof in response to a first multi-bit selection signal, where N is an integer greater than one. Similarly, the second N-to-1 selection circuit is configured to route a true or complementary version of the selected first input signal to an output thereof in response to a second multi-bit selection signal. The output driver includes a pull-up circuit, which is responsive to a signal generated at the output of the first N-to-1 selection circuit, and a pull-down circuit, which is responsive to a signal generated at the output of the second N-to-1 selection circuit.

According to some of these embodiments of the present invention, the pull-up circuit includes a first PMOS pull-up transistor having a gate terminal responsive to the signal generated at the output of the first N-to-1 selection circuit. In addition, the pull-down circuit includes a first NMOS pull-down transistor having a gate terminal responsive to the signal generated at the output of the second N-to-1 selection circuit. In some of these embodiments of the invention, the first N-to-1 selection circuit is configured to route the true or complementary version of the selected first input signal through at least one NMOS selection transistor and the second N-to-1 selection circuit is configured to route the true or complementary version of the selected first input signal through at least one PMOS selection transistor.

In still further embodiments of the invention, the pull-up circuit may include a second PMOS pull-up transistor, which has a source terminal electrically coupled to a drain terminal of the first PMOS pull-up transistor, and an NMOS node discharge transistor. This NMOS node discharge transistor has a drain terminal electrically coupled to the source terminal of the second PMOS pull-up transistor and a gate terminal electrically connected to gate terminals of the first and second PMOS pull-up transistors. According to alternative embodiments of the invention, pull-up circuit includes a PMOS node charging transistor having a gate terminal electrically connected to an output of the output driver and a drain terminal electrically connected to the gate terminal of the first PMOS pull-up transistor. According to these embodiments of the invention, the pull-down circuit may also include an NMOS node discharging transistor having a gate terminal electrically connected to an output of the output driver and a drain terminal electrically connected to the gate terminal of the first NMOS pull-down transistor.

According to still further embodiments of the present invention, the pull-up circuit includes a second PMOS pull-up transistor having a source terminal electrically coupled to a drain terminal of the first PMOS pull-up transistor and a gate terminal electrically connected to the gate terminal of the first PMOS pull-up transistor. A PMOS node discharge transistor is provided, which has a source terminal electrically connected to the source terminal of the second PMOS pull-up transistor and a gate terminal electrically connected to an output of the output driver. An NMOS node charging transistor is also provided, which has a source terminal electrically connected to a drain terminal of the first NMOS pull-down transistor and a gate terminal electrically connected to the output of the output driver.

In still further embodiments of the present invention, the pull-up circuit includes a second PMOS pull-up transistor having a source terminal electrically coupled to a drain terminal of the first PMOS pull-up transistor and a gate terminal electrically connected to the gate terminal of the first PMOS pull-up transistor. A third PMOS pull-up transistor is also provided, which has a source terminal electrically connected to the source terminal of the first PMOS pull-up transistor and a drain terminal electrically connected to the drain terminal of the first PMOS pull-up transistor. A first capacitor is provided, which has a first electrode electrically connected to the gate terminals of the first and second PMOS pull-up transistors and a second electrode electrically connected to the drain terminal of the first PMOS pull-up transistor. A latching inverter is further provided, which has an input electrically coupled to an output of the output driver and an output electrically connected to a gate terminal of the third PMOS pull-up transistor. The pull-down circuit may further include a second NMOS pull-down transistor having a source terminal electrically coupled to a drain terminal of the first NMOS pull-down transistor and a gate terminal electrically connected to the gate terminal of the first NMOS pull-down transistor. A third NMOS pull-down transistor having a drain terminal electrically connected to the drain terminal of the first NMOS pull-down transistor and a gate terminal electrically connected to the output of said latching inverter. This pull-down circuit further includes a second capacitor having a first electrode electrically connected to the gate terminals of the first and second NMOS pull-down transistors and a second electrode electrically connected to the drain terminal of the first NMOS pull-down transistor. In some of these embodiments of the invention, the second electrode of the first capacitor is electrically connected to the drain terminal of the third PMOS pull-up transistor and the second electrode of the second capacitor is electrically connected to the drain terminal of the third NMOS pull-down transistor.

According to still further embodiments of the invention, the pull-up circuit includes a second PMOS pull-up transistor having a gate terminal electrically connected to the gate terminal of the first PMOS pull-up transistor and a drain terminal electrically connected to a drain terminal of the first PMOS pull-up transistor. A third PMOS pull-up transistor is provided, which has a drain terminal electrically coupled to a source terminal of the second PMOS pull-up transistor. According to these embodiments of the invention, a latching inverter is provided, which has an input electrically connected to the drain terminals of the first and second PMOS pull-up transistors and an output electrically connected to a gate terminal of the third PMOS pull-up transistor. Some of these embodiments of the invention may also include a capacitor having a first terminal electrically connected to the gate terminals of the first and second PMOS pull-up transistors and a second terminal electrically connected to the drain terminals of the first and second PMOS pull-up transistors.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1:
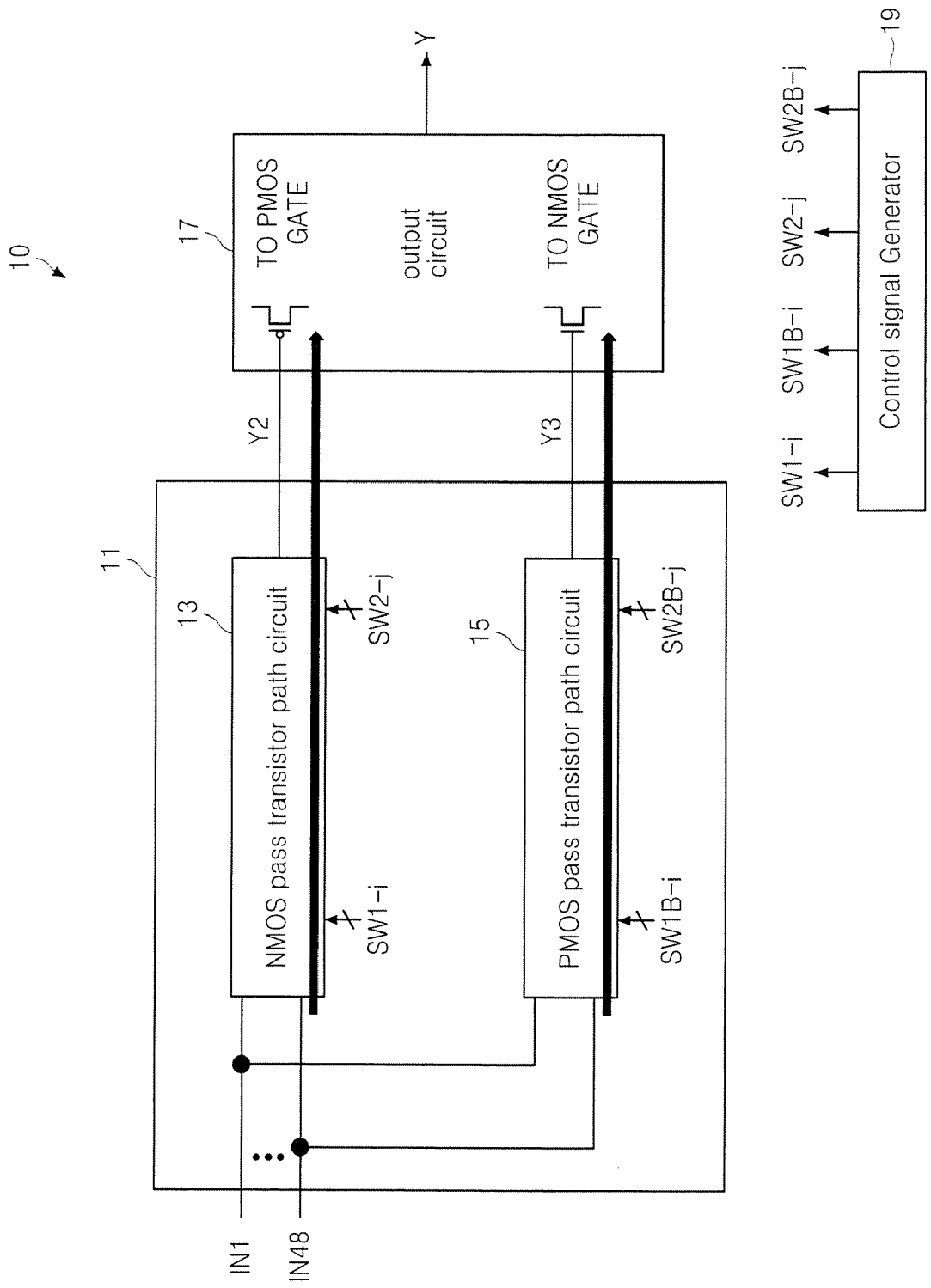
FIG. 1 is a schematic block diagram of a multiplexer according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a multiplexer 10 according to some embodiments of the present invention. The multiplexer 10 may be used in any type of semiconductor chip, e.g., a central processing unit (CPU), a digital signal processor (DSP), a video/audio chip, an application specific integrated circuit (ASIC), a system on chip (SOC), an MP3 audio chip, a wireless audio chip, an audio codec chip, an MPEG4 codec chip, an h264 codec chip, a video codec chip, a codec chip, or a voice codec chip. In addition, the multiplexer 10 may be used in an arithmetic logic unit (ALU) or a media access control (MAC) unit.

Referring to FIG. 1, the multiplexer 10 includes a path circuit 11, which includes a first path circuit 13 and a second path circuit 15, and an output circuit 17. For clarity of the description, in FIG. 1 is illustrated a control signal generator 19 which generates control signals SW1-i, SW1B-i, SW2j, and SW2B-j for controlling the operations of the first and second path circuits 13 and 15 where "i" and "j" are natural numbers, for example, "i" may be 1 to 48 and "j" may be 1 to 16. The control signals SW1-i and SW1B-i may be complementary to each other and the control signals SW2-j and SW2B-j may be complementary to each other, but the present invention is not restricted thereto.

Unlike a conventional multiplexer using a transmission gate, the multiplexer 10 according to the current embodiments of the present invention does not use the transmission gate. Since the conventional multiplexer includes a plurality of transmission gates, equivalent impedance, e.g., equivalent capacitance, viewed from an output terminal of the conventional multiplexer is quite high. Accordingly, when the conventional multiplexer is used in a logic or data path, data processing is delayed.

In order to increase data processing speed, the multiplexer 10 includes the first path circuit 13 using a plurality of first type metal-oxide semiconductor field effect transistors (MOSFETs) as pass transistors and the second path circuit 15 using a plurality of second type MOSFETs as pass transistors. Here, the first type may be an n-channel type and the second type may be a p-channel type or vice versa.

The output circuit 17 generates an output signal Y in response to a signal Y2 output from the first path circuit 13 and a signal Y3 output from the second path circuit 15. The output circuit 17 may be implemented by an inverter whose input terminals are separated from each other. The output circuit 17 will be described in detail with reference to FIGS. 9 through 11 later. The signal Y2 from the first path circuit 13 and the signal Y3 from the second path circuit 15 drive a second type MOSFET and a first type MOSFET, respectively, in the output circuit 17.

Figure 2:
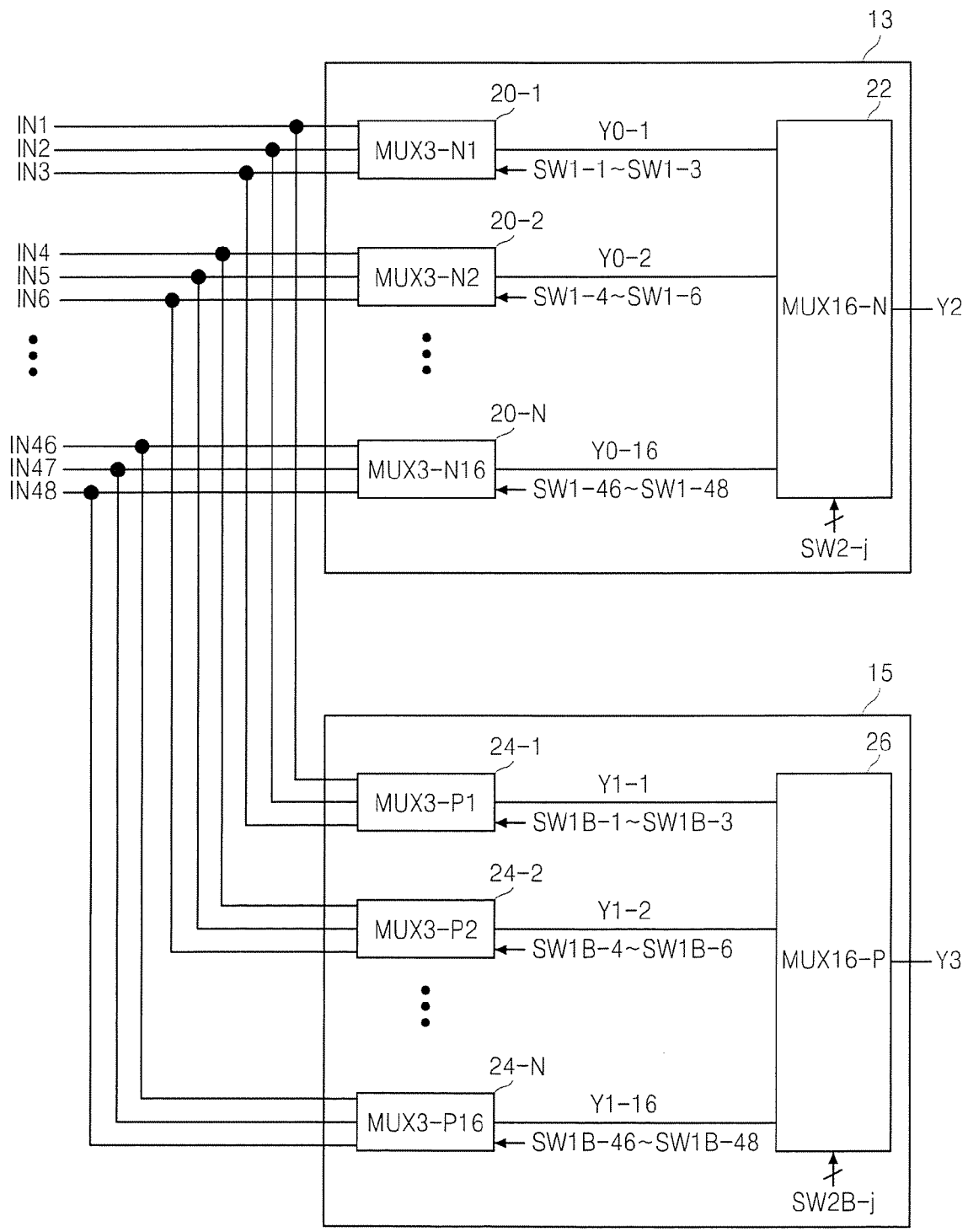
FIG. 2 is a detailed block diagram of a the multiplexer circuit illustrated in FIG. 1.

FIG. 2 is a detailed block diagram of the path circuit 11 illustrated in FIG. 1. Referring to FIG. 2, the first path circuit 13 includes a plurality of first type first stage multiplexers 20-1 through 20-N (where N is a natural number, e.g., N=16) corresponding to a group 20 and a first type second stage multiplexer 22. When 48 input signals IN1 through IN48 are received, each of the first type first stage multiplexers 20-1 through 20-N may be implemented by an A-input 1-output multiplexer and the first type second stage multiplexer 22 may be implemented by a B-input 1-output multiplexer. For instance, A may be 3 and B may be 16. When A is 4, B may be 12. When A is 6, B may be 8.

For clarity of the description, the first path circuit 13 includes the two stages 20 and 22, but the first path circuit 13 may include three or more stages connected in series or cascade in other embodiments. For instance, when the 48 input signals IN1 through IN48 are received and the multiplexer 10 is implemented in three stages, at least one first type first stage multiplexer may be implemented by an A-input 1-output multiplexer, at least one first type second stage multiplexer may be implemented by a B-input 1-output multiplexer, and at least one first type third stage multiplexer may be implemented by a C-input 1-output multiplexer. Here, A may be 3, B may be 4, and C may be 4.

The second path circuit 15 includes a plurality of second type first stage multiplexers 24-1 through 24-N (where N is a natural number, e.g., N=16) corresponding to a group 24 and a second type second stage multiplexer 26. When the 48 input signals IN1 through IN48 are received, each of the second type first stage multiplexers 24-1 through 24-N may be implemented by a 3-input 1-output multiplexer and the second type second stage multiplexer 26 may be implemented by a 16-input 1-output multiplexer. For clarity of the description, the second path circuit 15 includes the two stages 24 and 26, but the second path circuit 15 may include three or more stages connected in series or cascade in other embodiments.

The first type first stage multiplexer 20-1 outputs one signal among a plurality of the input signals IN1 through IN3 as an output signal Y0-1 in response to a plurality of control signals SW1-1 through SW1-3. The second type first stage multiplexer 24-1 outputs one signal among a plurality of the input signals IN1 through IN3 as an output signal Y1-1 in response to a plurality of control signals SW1B-1 through SW1B-3. The first type first stage multiplexer 20-2 outputs one signal among a plurality of the input signals IN4 through IN6 as an output signal Y0-2 in response to a plurality of control signals SW1-4 through SW1-6. The second type first stage multiplexer 24-2 outputs one signal among a plurality of the input signals IN4 through IN6 as an output signal Y1-2 in response to a plurality of control signals SW1B-4 through SW1B-6. The first type first stage multiplexer 20-N outputs one signal among a plurality of the input signals IN46 through IN48 as an output signal Y0-16 in response to a plurality of control signals SW1-46 through SW1-48. The second type first stage multiplexer 24-N outputs one signal among a plurality of the input signals IN46 through IN48 as an output signal Y1-16 in response to a plurality of control signals SW1B-46 through SW1B-48.

The first type second stage multiplexer 22 outputs one signal among the output signals Y0-1 through Y0-16 (corresponding to a group Y0) from the first type first stage multiplexers 20-1 through 20-N as an output signal Y2 in response to a plurality of control signals SW2-j. The second type second stage multiplexer 26 outputs one signal among the output signals Y1-1 through Y1-16 (corresponding to a group Y1) from the second type first stage multiplexers 24-1 through 24-N as an output signal Y3 in response to a plurality of control signals SW2B-j.

Figure 3:
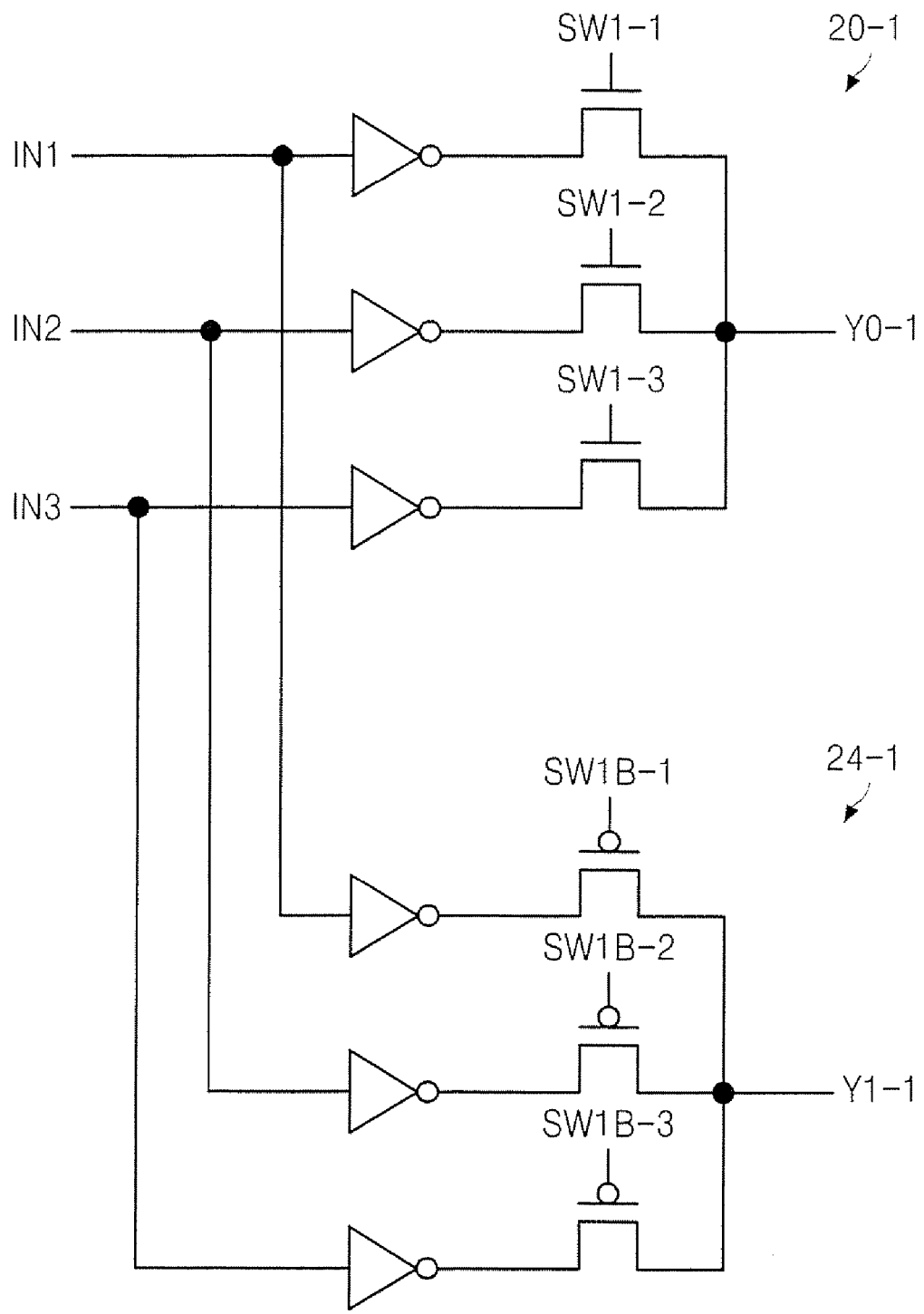
FIG. 3 is a circuit diagram of a first type first stage multiplexer and a second type first stage multiplexer, which are illustrated in FIG. 2.

FIG. 3 is a circuit diagram of the first type first stage multiplexer 20-1 and the second type first stage multiplexer 24-1, which are illustrated in FIG. 2. As described with reference to FIG. 2 above, the first type first stage multiplexer 20-1 includes three inverters and three pass transistors implemented in the first type and outputs one of the input signals IN1 through IN3 as the output signal Y0-1 in response to the control signals SW1-1 through SW1-3. At this time, the inverters respectively drive the pass transistors. The second type first stage multiplexer 24-1 includes three inverters and three pass transistors implemented in the second type and outputs one of the input signals IN1 through IN3 as the output signal Y1-1 in response to the control signals SW1B-1 through SW1B-3. At this time, the inverters respectively drive the pass transistors.

Figure 4:
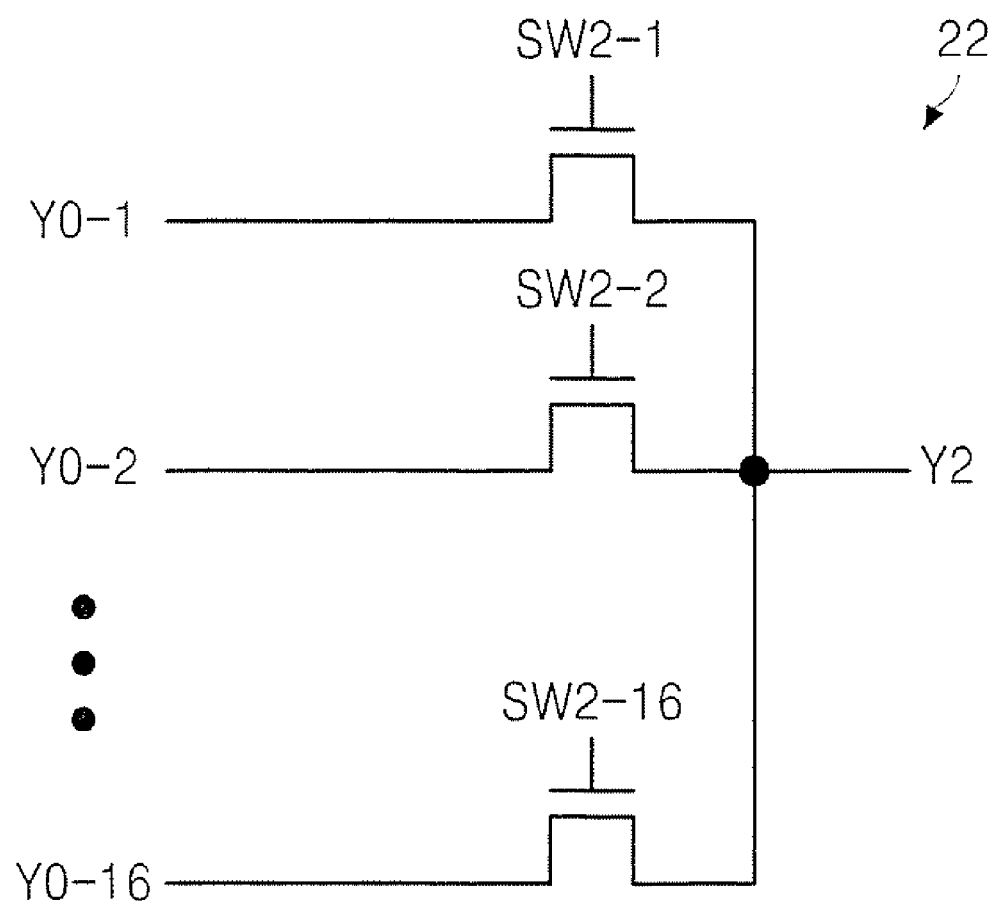
FIG. 4 is a circuit diagram of a first type second stage multiplexer illustrated in FIG. 2.

FIG. 4 is a circuit diagram of the first type second stage multiplexer 22 illustrated in FIG. 2. Referring to FIGS. 2 and 4, the first type second stage multiplexer 22 includes a plurality of (e.g., 16) first type MOSFETs. Accordingly, the first type second stage multiplexer 22 outputs one of the output signals Y0-1 through Y0-16 from the first type first stage multiplexers 20-1 through 20-N as the output signal Y2 in response to the control signals SW2-1 through SW2-16.

Figure 5:
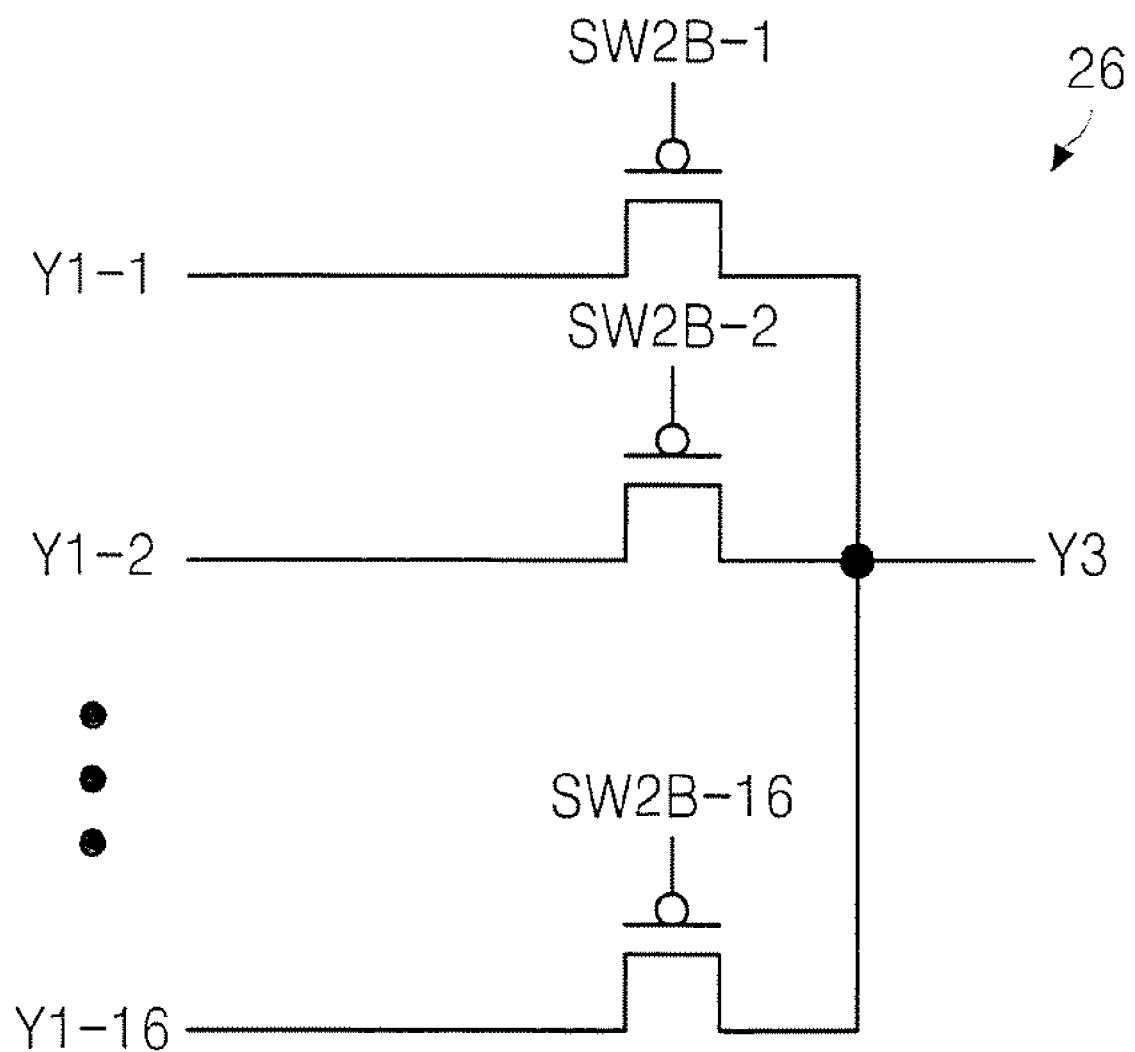
FIG. 5 is a circuit diagram of a second type second stage multiplexer illustrated in FIG. 2.

FIG. 5 is a circuit diagram of the second type second stage multiplexer 26 illustrated in FIG. 2. Referring to FIGS. 2 and 5, the second type second stage multiplexer 26 includes a plurality of (e.g., 16) second type MOSFETs. Accordingly, the second type second stage multiplexer 26 outputs one of the output signals Y1-1 through Y1-16 from the second type first stage multiplexers 24-1 through 24-N as the output signal Y3 in response to the control signals SW2B-1 through SW2B-16.

Figure 6:
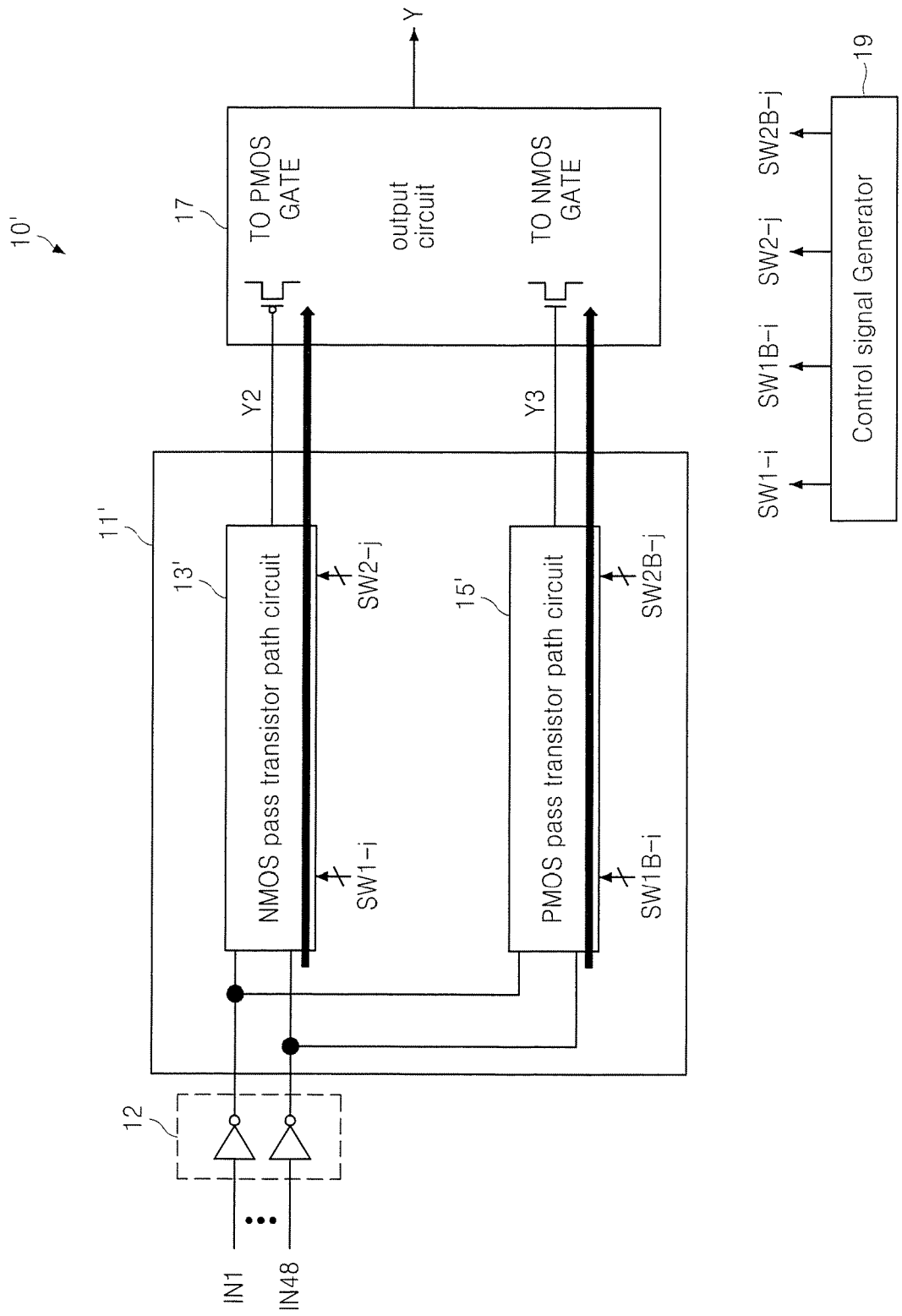
FIG. 6 is a schematic block diagram of a multiplexer according to other embodiments of the present invention.

FIG. 6 is a schematic block diagram of a multiplexer 10' according to other embodiments of the present invention. The multiplexer 10' includes an inverter block 12, a path circuit 11', which includes a first path circuit 13' and a second path circuit 15', and the output circuit 17. For clarity of the description, in FIG. 6 is illustrated the control signal generator 19 which generates the control signals SW1-*i*, SW1B-i, SW2-*j*, and SW2B-j. The inverter block 12 inverts the input signals IN1 through IN48 and includes as many inverters as the number of the input signals IN1 through IN48.

Figure 7:
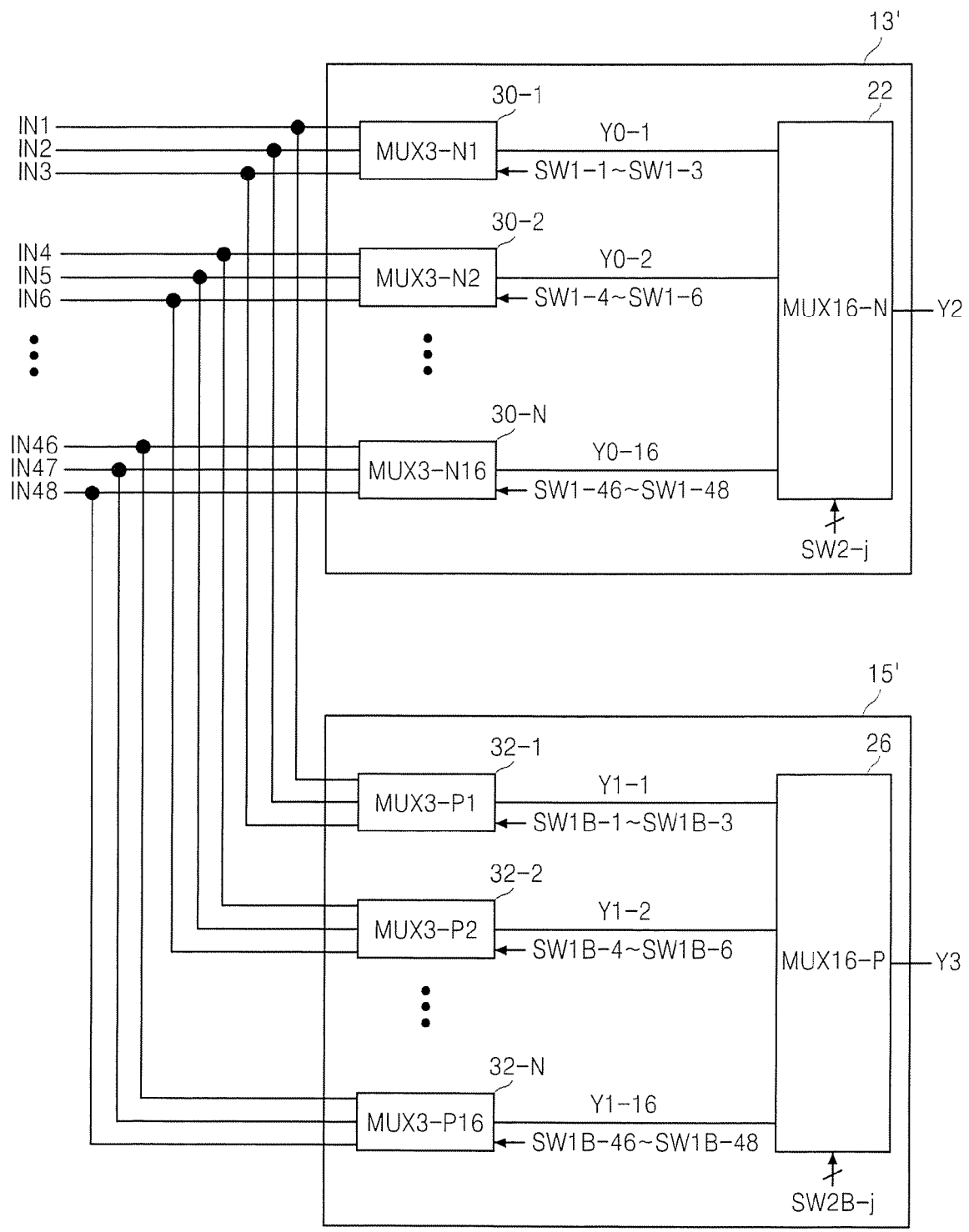
FIG. 7 is a detailed block diagram of a path circuit illustrated in FIG. 6.

FIG. 7 is a detailed block diagram of the path circuit 11' illustrated in FIG. 6. Referring to FIGS. 6 and 7, the first path circuit 13' includes a plurality of first type first stage multiplexers 30-1 through 30-N (where N is a natural number, e.g., N=16) corresponding to a group 30 and the first type second stage multiplexer 22. When the 48 input signals IN1 through IN48 are received, each of the first type first stage multiplexers 30-1 through 30-N may be implemented by an A-input 1-output multiplexer and the first type second stage multiplexer 22 may be implemented by a B-input 1-output multiplexer. At this time, A may be 3 and B may be 16. For clarity of the description, the first path circuit 13' includes the two stages 30 and 22, but the first path circuit 13' may include three or more stages in other embodiments of the present invention.

The second path circuit 15' includes a plurality of second type first stage multiplexers 32-1 through 32-N (where N is a natural number, e.g., N=16) corresponding to a group 32 and the second type second stage multiplexer 26. When the 48 input signals IN1 through IN48 are received, each of the second type first stage multiplexers 32-1 through 32-N may be implemented by an A-input 1-output multiplexer and the second type second stage multiplexer 26 may be implemented by a B-input 1-output multiplexer. At this time, A may be 3 and B may be 16. For clarity of the description, the second path circuit 15' includes the two stages 32 and 26, but the second path circuit 15' may include three or more stages in other embodiments of the present invention.

Figure 8:
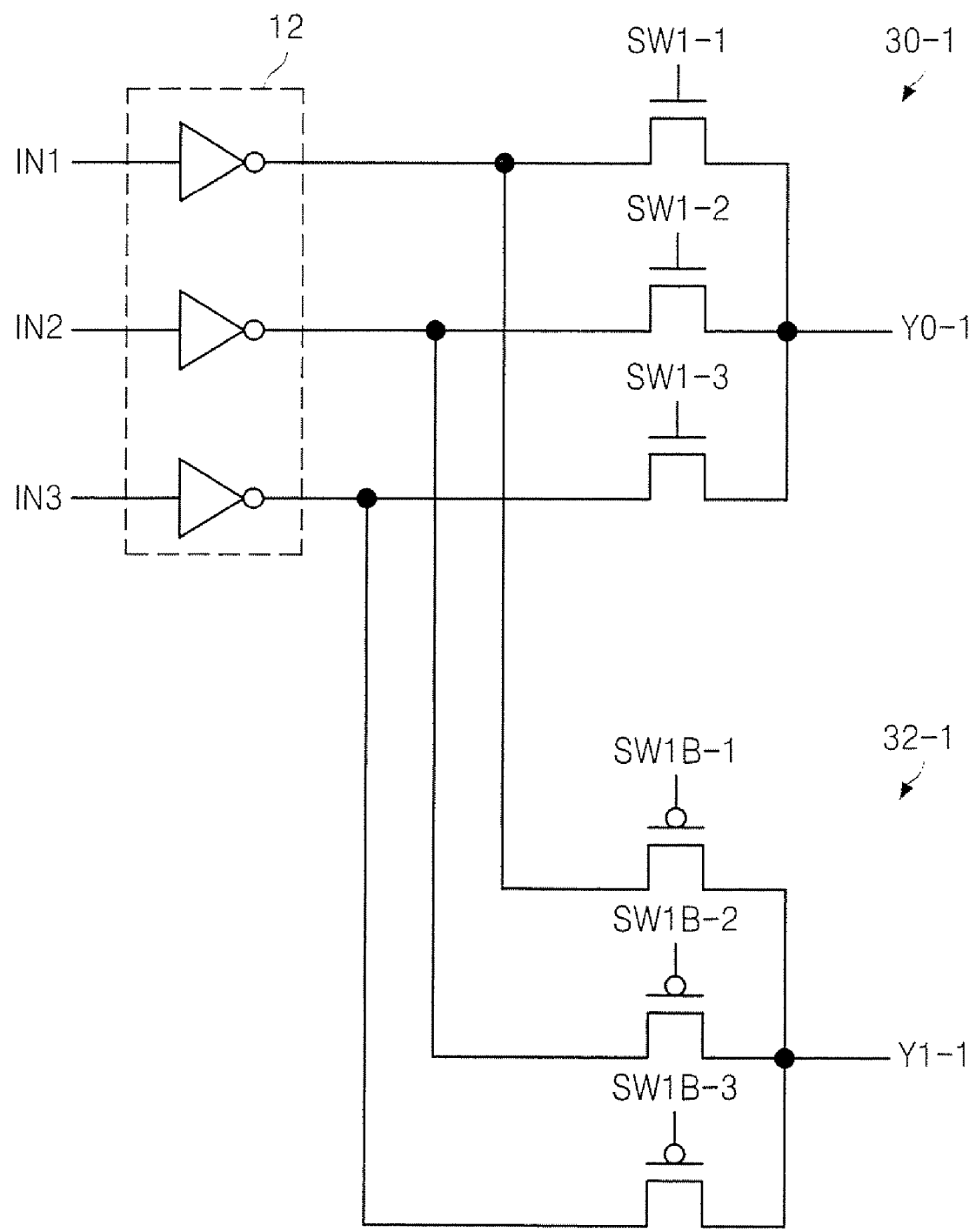
FIG. 8 is a circuit diagram of a first type first stage multiplexer and a second type first stage multiplexer, which are illustrated in FIG. 7.

FIG. 8 is a circuit diagram of the first type first stage multiplexer 30-1 and the second type first stage multiplexer 32-1, which are illustrated in FIG. 7. For clarity of the description, in FIG. 8 is additionally illustrated the inverter block 12 including three inverters corresponding to the first type first stage multiplexer 30-1. Referring to FIGS. 3 and 8, each inverter shown FIG. 8 can drive one first type MOSFET and one second type MOSFET at the same time.

Figure 9:
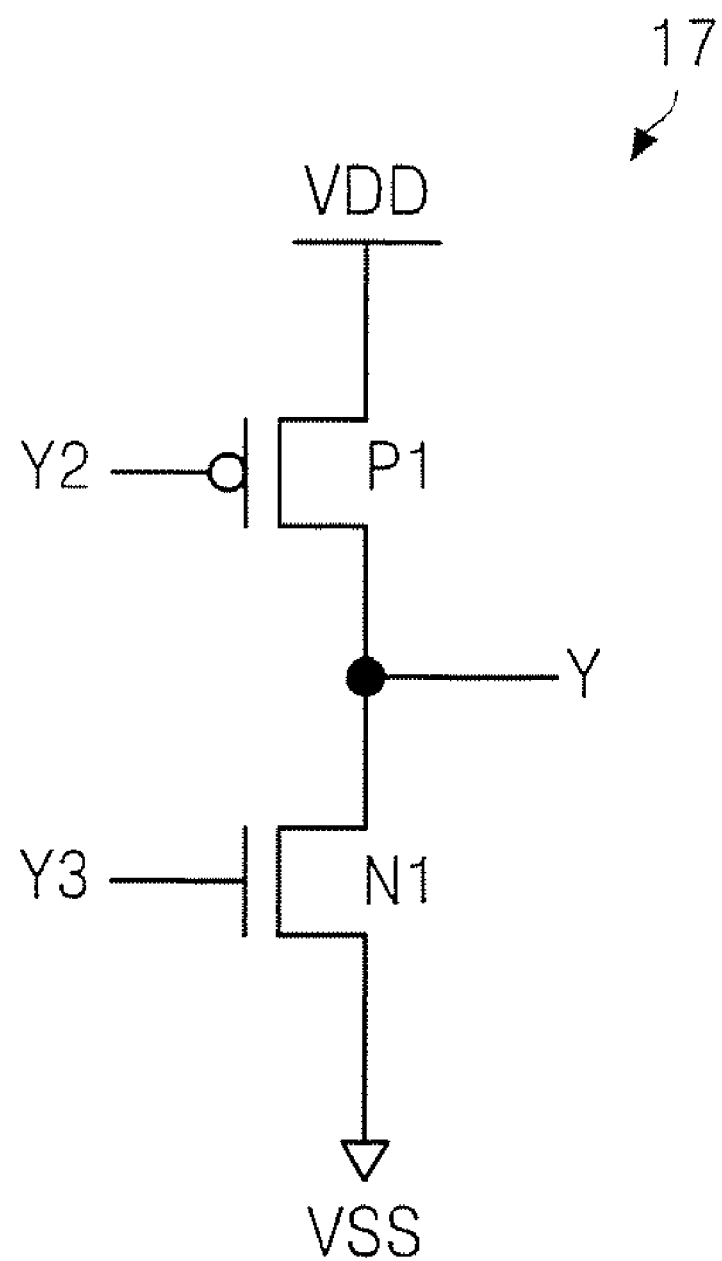
FIG. 9 is a diagram of an output circuit illustrated in FIG. 1 or 6, according to some embodiments of the present invention.

FIG. 9 is a diagram of the output circuit 17 illustrated in FIG. 1 or 6, according to some embodiments of the present invention. Referring to FIGS. 1, 6, and 9, the output circuit 17, which is implemented by a inverter including input terminals separated from each other, includes a pull-up circuit P1 and a pull-down circuit N1. The pull-up circuit P1 may be implemented by a second type MOSFET and the pull-down circuit N1 may be implemented by a first type MOSFET. The pull-up circuit P1 pulls up an output of the output circuit 17 in response to a level of the output signal Y2 from the first path circuit 13 or 13' and the pull-down circuit N1 pulls down the output of the output circuit 17 in response to a level of the output signal Y3 from the second path circuit 15 or 15'. The output circuit 17 has an inverter structure in which the input terminals are separated from each other in order to minimize junction slow down.

Figure 10:
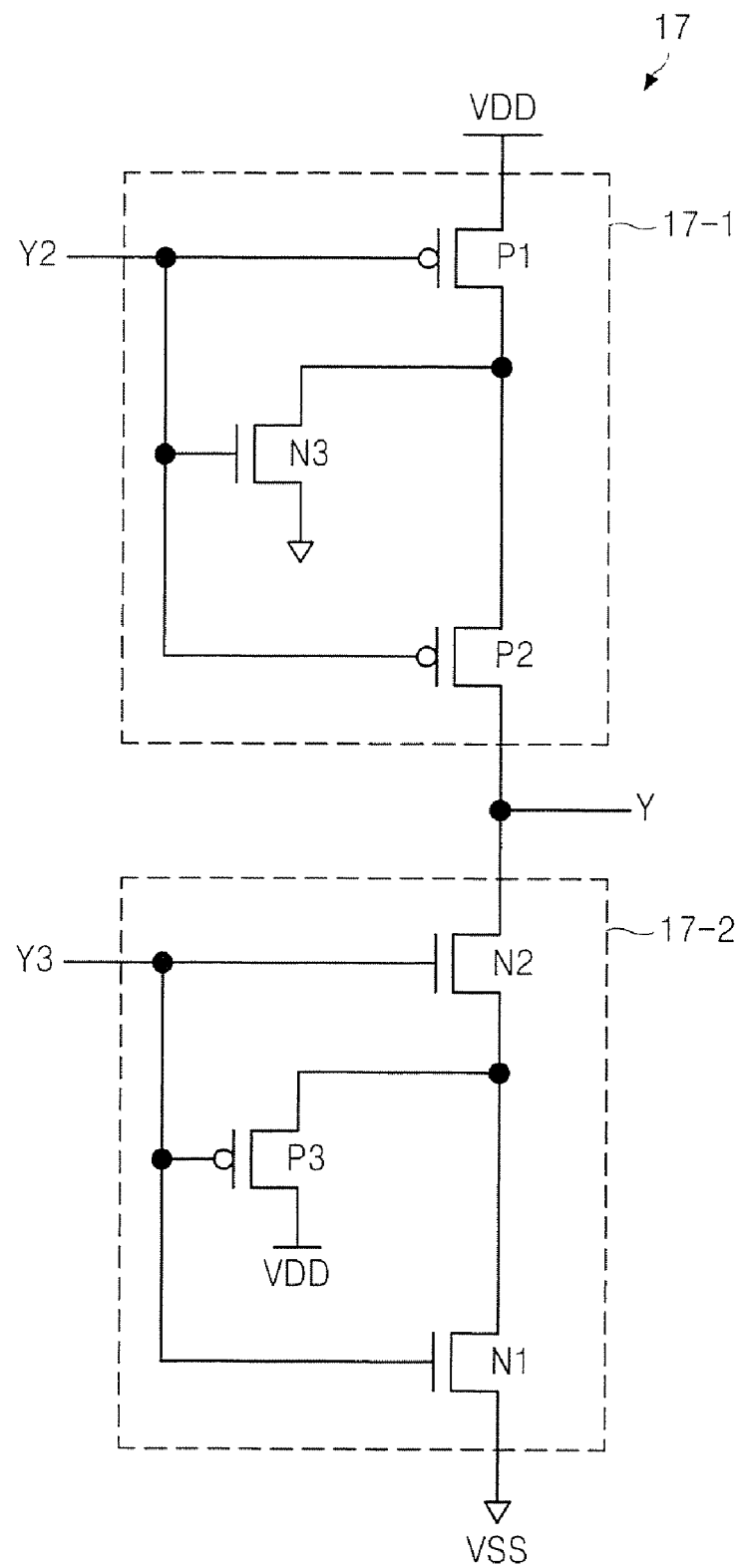
FIG. 10 is a diagram of the output circuit illustrated in FIG. 1 or 6, according to other embodiments of the present invention.

FIG. 10 is a diagram of the output circuit 17 illustrated in FIG. 1 or 6, according to other embodiments of the present invention. Referring to FIGS. 1, 6, and 10, the output circuit 17, which can be implemented by an inverter having separate input terminals, includes a pull-up circuit 17-1 and a pull-down circuit 17-2.

The pull-up circuit 17-1 has a structure for reducing leakage current and includes a plurality of MOSFETs P1, P2, and N3. The second type MOSFETs P1 and P2 are connected in series between a first power supply, e.g., a power supply generating a supply voltage VDD, and an output terminal of the output circuit 17. The output signal Y2 output from the first path circuit 13 or 13' is applied to a gate of each of the MOSFETs P1, P2, and N3. The first type MOSFET N3 is connected between a common node of the second type MOSFETs P1 and P2 and a second power supply, e.g., ground VSS. The second type MOSFETs P1 and P2 may be implemented in a stack.

The pull-down circuit 17-2 has a structure for reducing leakage current and includes a plurality of MOSFETs N1, N2, and P3. The first type MOSFETs N1 and N2 are connected in series between the output terminal of the output circuit 17 and the second power supply VSS. The output signal Y3 output from the second path circuit 15 or 15' is applied to a gate of each of the MOSFETs N1, N2, and P3. The second type MOSFET P3 is connected between a common node of the first type MOSFETs N1 and N2 and the first power supply VDD. The first type MOSFETs N1 and N2 may be implemented in a stack.

Figure 11:
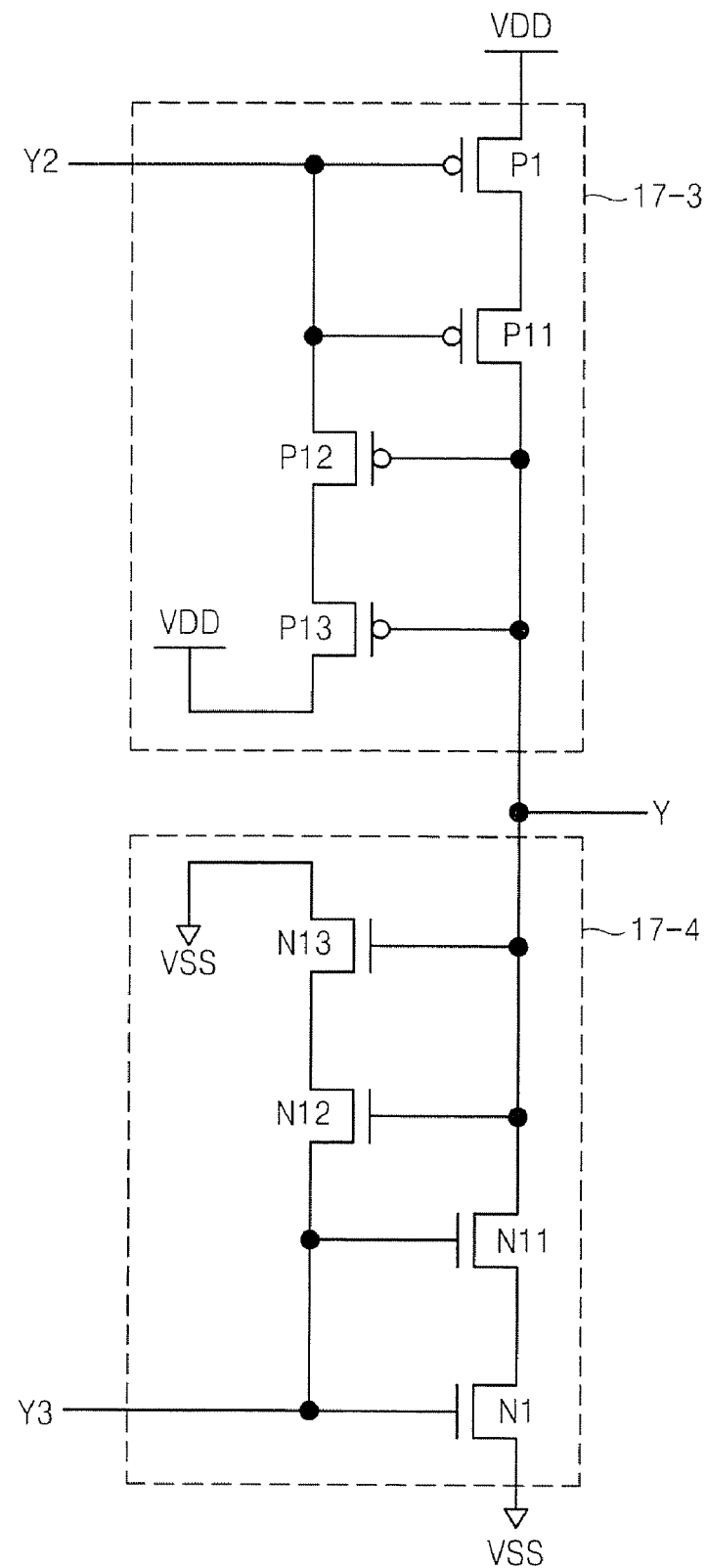
FIG. 11 is a diagram of the output circuit illustrated in FIG. 1 or 6, according to further embodiments of the present invention.

FIG. 11 is a diagram of the output circuit 17 illustrated in FIG. 1 or 6, according to further embodiments of the present invention. Referring to FIGS. 1, 6, and 11, the output circuit 17 having separate input terminals includes a pull-up circuit 17-3 and a pull-down circuit 17-4.

The pull-up circuit 17-3 has a structure for reducing leakage current and includes a plurality of MOSFETs P1, P11, P12, and P13. The second type MOSFETs P1 and P11 are connected in series between the first power supply VDD and the output terminal of the output circuit 17. The signal Y2 output from the first path circuit 13 or 13' is applied to a gate of each of the second type MOSFETs P1 and P11. Alternatively, only one of the second type MOSFETs P1 and P11 may be connected between the first power supply and the output terminal of the output circuit 17. The second type MOSFETs P12 and P13 are connected in series between the first power supply VDD and the gate of the second type MOSFET P1 and a gate of each of the second type MOSFETs P12 and P13 is connected with the output terminal of the output circuit 17. Alternatively, only one of the second type MOSFETs P12 and P13 may be connected between the first power supply VDD and the gate of the second type MOSFET P1.

In other embodiments of the present invention, three or more second type MOSFETs may be connected in series between the first power supply VDD and the output terminal of the output circuit 17 and the signal Y2 output from the first path circuit 13 or 13' may be applied to a gate of each of the second type MOSFETs. Also, three or more second type MOSFETs may be connected in series between the first power supply VDD and the gate of the second type MOSFET P1 and a gate of each of the second type MOSFETs may be connected with the output terminal of the output circuit 17.

The pull-down circuit 17-4 having a structure for reducing leakage current includes a plurality of MOSFETs N1, N11, N12, and N13. The first type MOSFETs N1 and N11 are connected in series between the output terminal of the output circuit 17 and the second power supply VSS and the signal Y3 output from the second path circuit 15 or 15' is applied to a gate of each of the first type MOSFETs N1 and N11. Alternatively, only of the first type MOSFETs N1 and N11 may be connected between the output terminal of the output circuit 17 and the second power supply VSS. The first type MOSFETs N12 and N13 are connected in series between the second power supply VSS and the gate of the first type MOSFET N1 and a gate of each of the first type MOSFETs N12 and N13 is connected with the output terminal of the output circuit 17. Alternatively, only one of the first type MOSFETs N12 and N13 may be connected between the second power supply VSS and the gate of the first type MOSFET N1.

In other embodiments of the present invention, three or more first type MOSFETs may be connected in series between the output terminal of the output circuit 17 and the second power supply VSS and the signal Y3 output from the second path circuit 15 or 15' may be applied to a gate of each of the first type MOSFETs. Also, three of more first type MOSFETs may be connected in series between the second power supply VSS and the gate of the first type MOSFET N1 and a gate of each of the first type MOSFETs may be connected with the output terminal of the output circuit 17.

Figure 12:
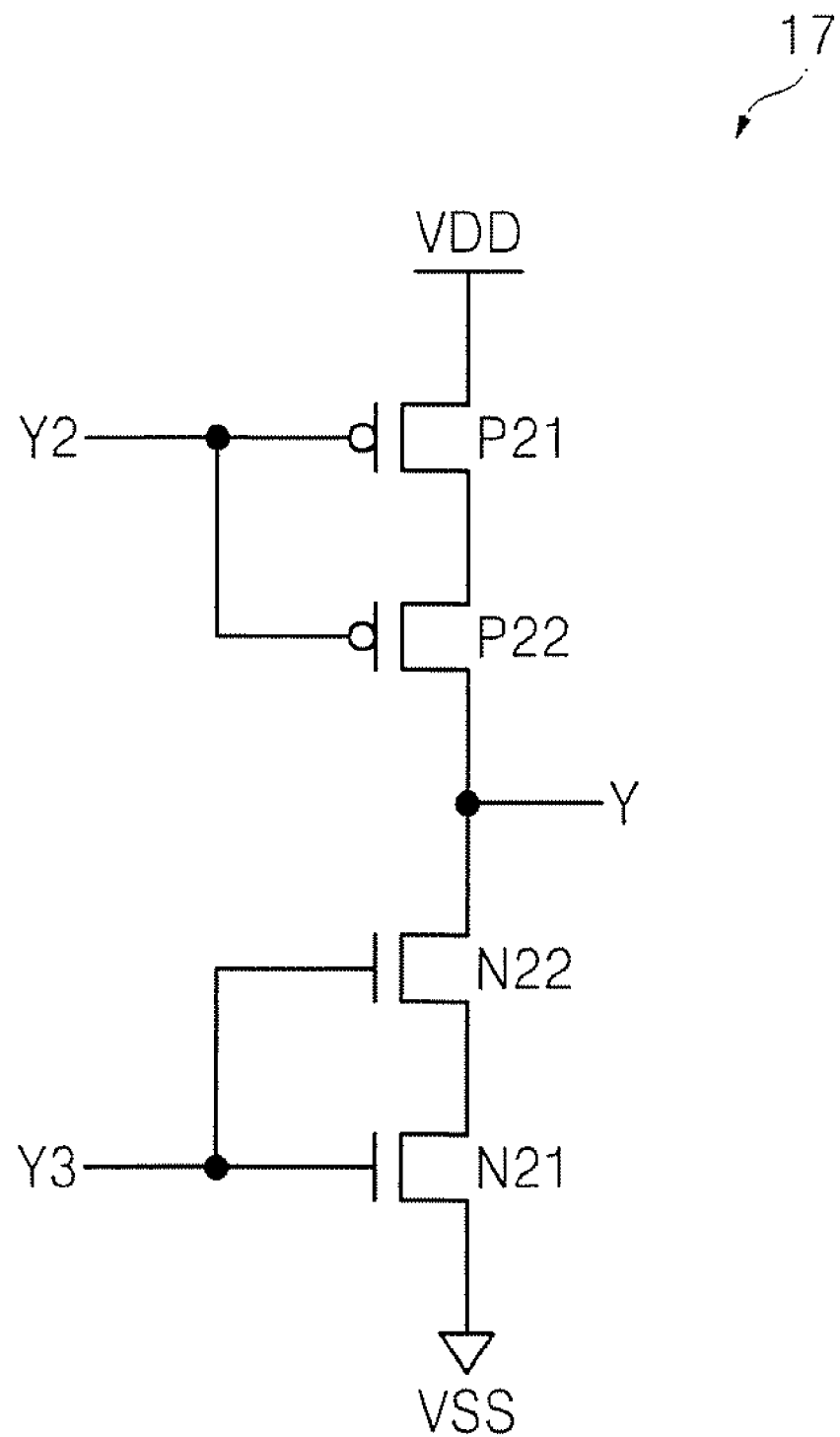
FIG. 12 is a diagram of the output circuit illustrated in FIG. 1 or 6, according to other embodiments of the present invention.

FIG. 12 is a diagram of the output circuit 17 illustrated in FIG. 1 or 6, according to other embodiments of the present invention. Referring to FIG. 12, second type MOSFETs P21 and P22 are connected in series between the first power supply VDD and the output terminal of the output circuit 17 and the signal Y2 output from the first path circuit 13 or 13' is applied to a gate of each of the second type MOSFETs P21 and P22. First type MOSFETs N21 and N22 are connected in series between the output terminal of the output circuit 17 and the second power supply VSS and the signal Y3 output from the second path circuit 15 or 15' is applied to a gate of each of the first type MOSFETs N21 and N22.

Figure 13:
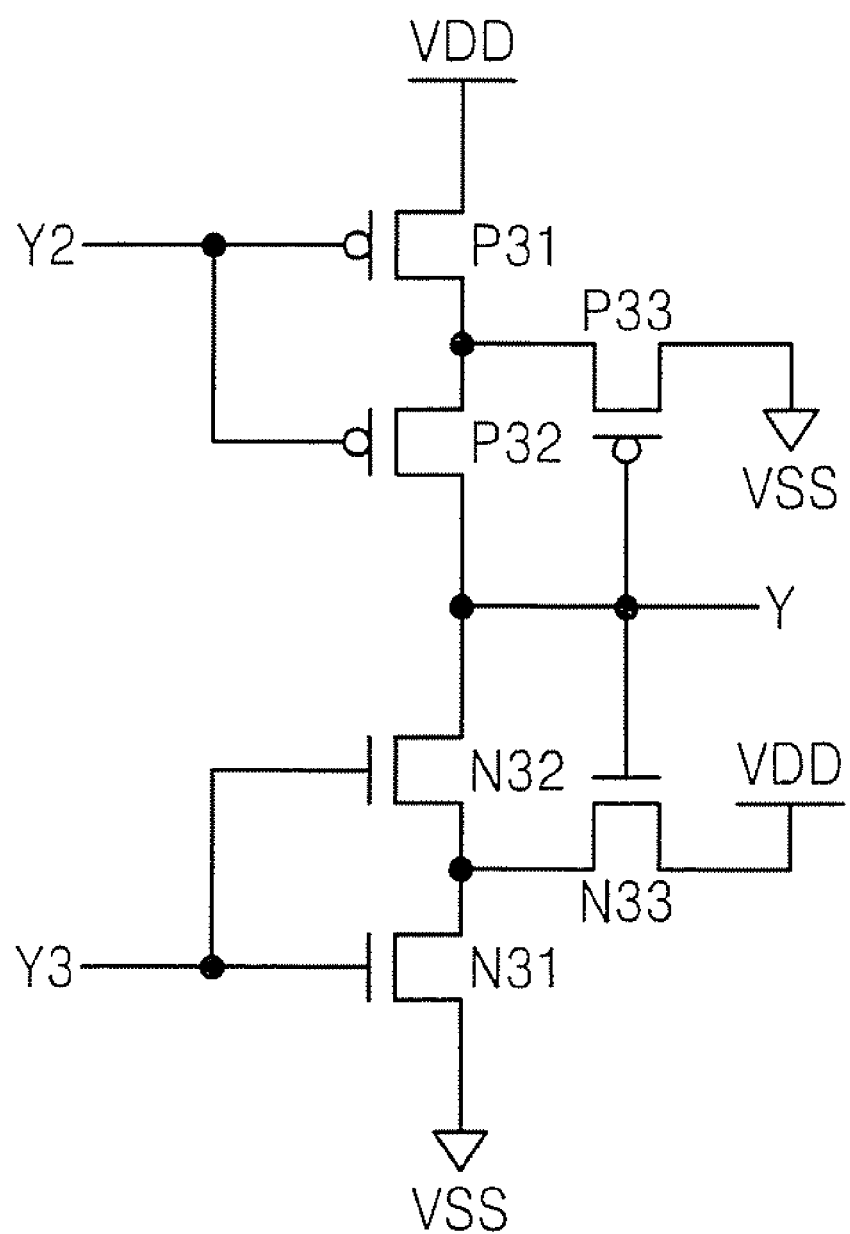
FIG. 13 is a diagram of the output circuit illustrated in FIG. 1 or 6, according to yet other embodiments of the present invention.

FIG. 13 is a diagram of the output circuit 17 illustrated in FIG. 1 or 6, according to yet other embodiments of the present invention. Referring to FIG. 13, second type MOSFETs P31 and P32 are connected between the first power supply VDD and the output terminal of the output circuit 17 and the signal Y2 output from the first path circuit 13 or 13' is applied to a gate of each of the second type MOSFETs P31 and P32. First type MOSFETs N31 and N32 are connected between the output terminal of the output circuit 17 and the second power supply VSS and the signal Y3 output from the second path circuit 15 or 15' is applied to a gate of each of the first type MOSFETs N31 and N32.

A second type MOSFET P33 is connected between a common node of the second type MOSFETs P31 and P32 and the second power supply VSS and a gate of the second type MOSFET P33 is connected with the output terminal of the output circuit 17. A first type MOSFET N33 is connected between a common node of the first type MOSFETs N31 and N32 and the first power supply VDD and a gate of the first type MOSFET N33 is connected with the output terminal of the output circuit 17.

Figure 14:
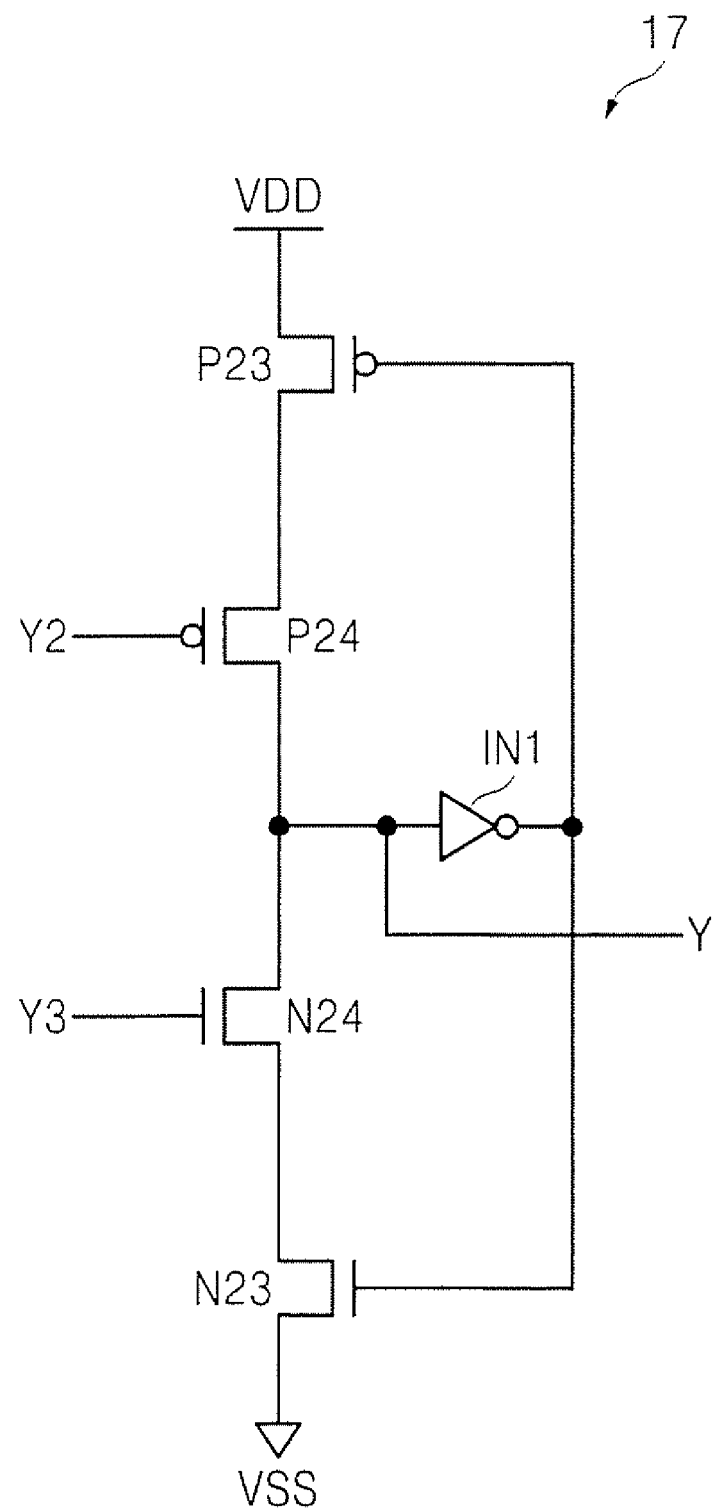
FIG. 14 is a diagram of the output circuit illustrated in FIG. 1 or 6, according to still other embodiments of the present invention.

FIG. 14 is a diagram of the output circuit 17 illustrated in FIG. 1 or 6, according to still other embodiments of the present invention. Referring to FIG. 14, second type MOSFETs P23 and P24 are connected between the first power supply VDD and the output terminal of the output circuit 17 and the signal Y2 output from the first path circuit 13 or 13' is applied to a gate of the second type MOSFET P24. An inverter IN1 is connected between the output terminal of the output circuit 17 and a gate of the second type MOSFET P23.

First type MOSFETs N23 and N24 are connected between the second power supply VSS and the output terminal of the output circuit 17 and the signal Y3 output from the second path circuit 15 or 15' is applied to a gate of the first type MOSFET N24. The inverter IN1 is connected between the output terminal of the output circuit 17 and a gate of the first type MOSFET N23.

Figure 15:
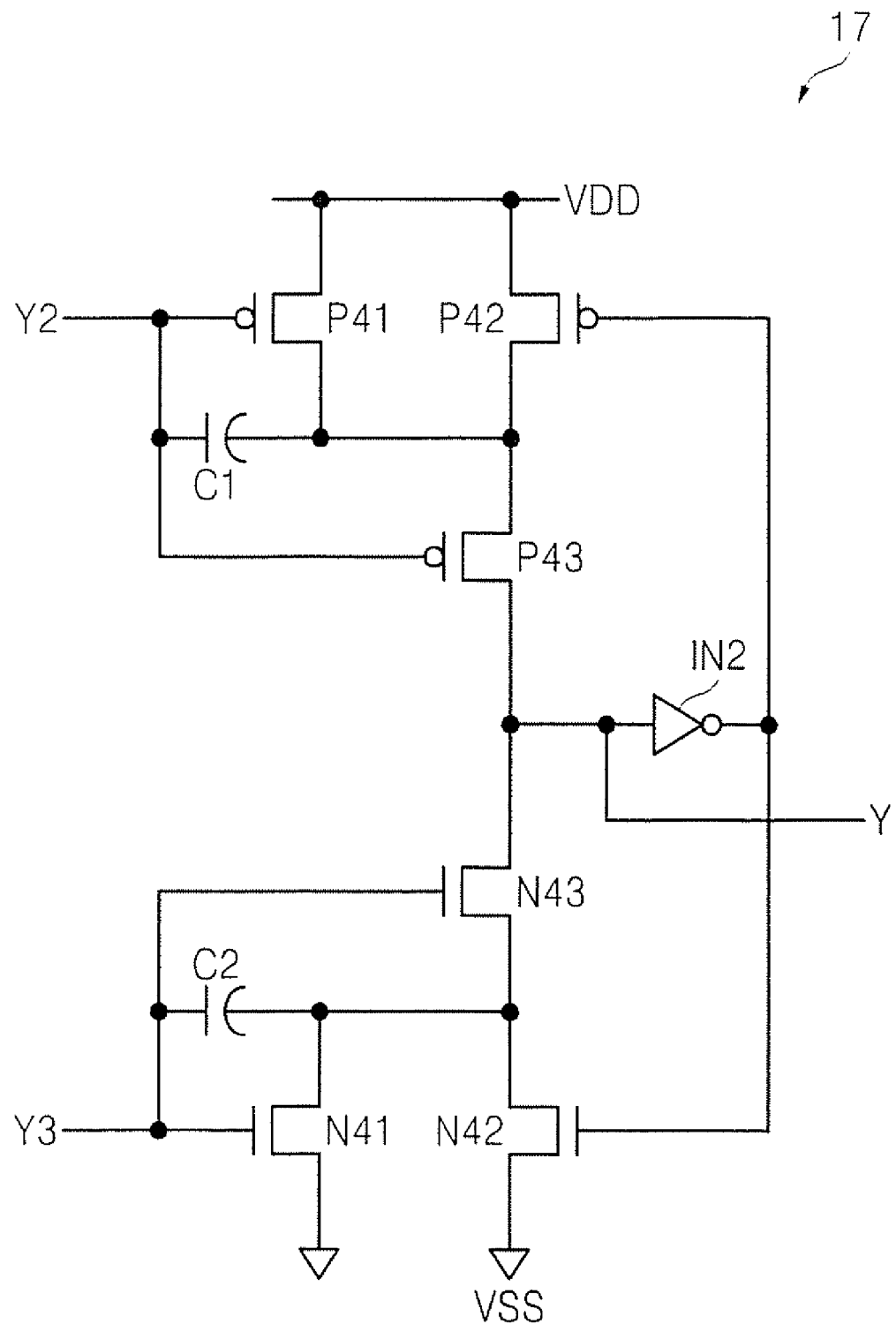
FIG. 15 is a diagram of the output circuit illustrated in FIG. 1 or 6, according to further embodiments of the present invention.

FIG. 15 is a diagram of the output circuit 17 illustrated in FIG. 1 or 6, according to further embodiments of the present invention. Referring to FIG. 15, second type MOSFETs P42 and P43 are connected between the first power supply VDD and the output terminal of the output circuit 17 and a second type MOSFET P41 is connected between the first power supply VDD and a common node of the second type MOSFETs P42 and P43. An end of a first capacitor C1 is connected with the common node of the second type MOSFETs P42 and P43. The signal Y2 output from the first path circuit 13 or 13' is applied to a gate of each of the second type MOSFETs P41 and P43 and another end of the first capacitor C1. An inverter IN2 is connected between the output terminal of the output circuit 17 and a gate of the second type MOSFET P42.

First type MOSFETs N42 and N43 are connected between the second power supply VSS and the output terminal of the output circuit 17 and a first type MOSFET N41 is connected between the second power supply VSS and a common node of the first type MOSFETs N42 and N43. An end of a second capacitor C2 is connected with the common node of the first type MOSFETs N42 and N43. The signal Y3 output from the second path circuit 15 or 15' is applied to a gate of each of the first type MOSFETs N41 and N43 and another end of the second capacitor C2. An output signal of the inverter IN2 is applied to a gate of the first type MOSFET N42.

Figure 16:
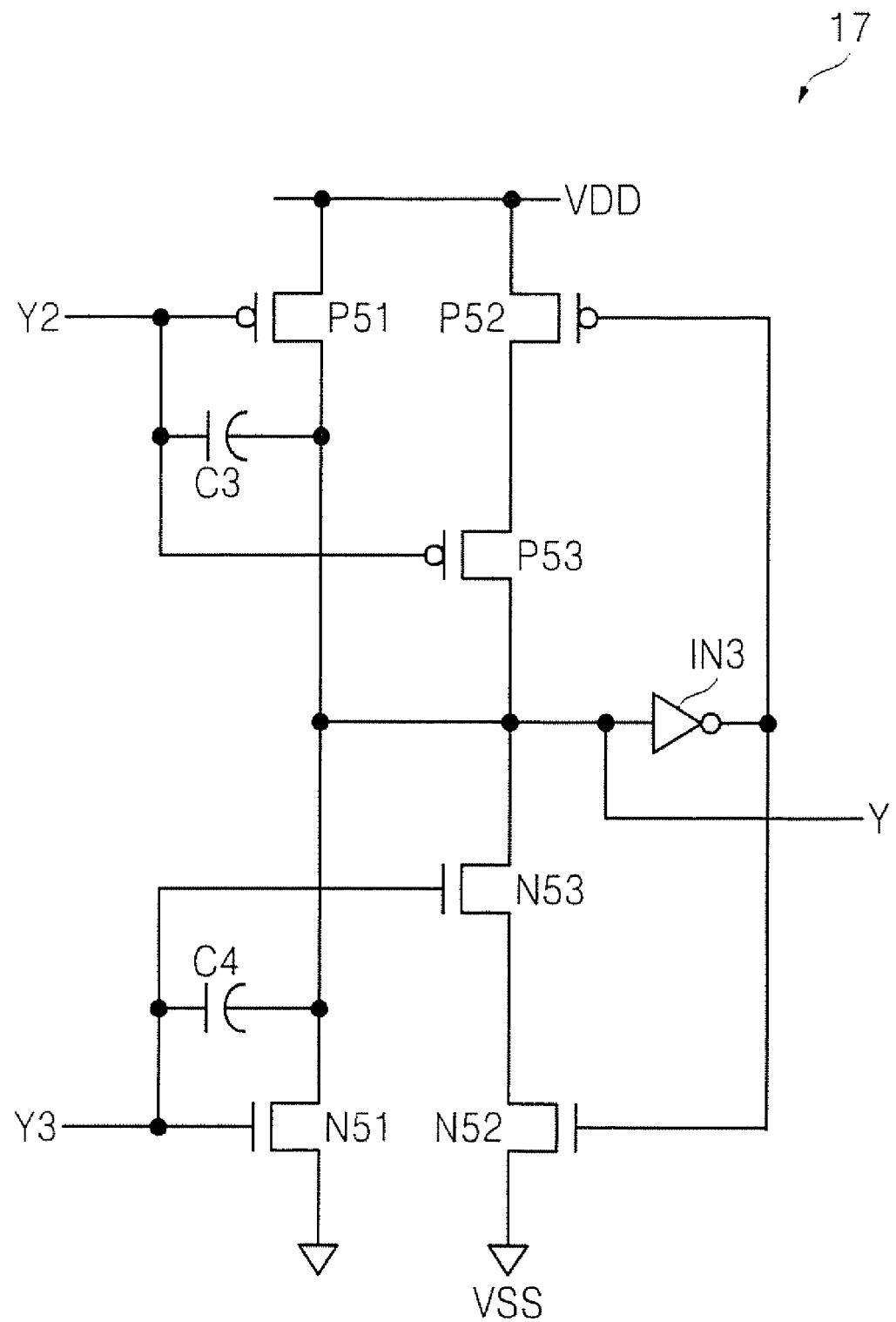
FIG. 16 is a diagram of the output circuit illustrated in FIG. 1 or 6, according to other embodiments of the present invention.

FIG. 16 is a diagram of the output circuit 17 illustrated in FIG. 1 or 6, according to other embodiments of the present invention. Referring to FIG. 16, second type MOSFETs P52 and P53 are connected between the first power supply VDD and the output terminal of the output circuit 17. A second type MOSFET P51 is also connected between the first power supply VDD and the output terminal of the output circuit 17. An end of a third capacitor C3 is connected with the output terminal of the output circuit 17. The signal Y2 output from the first path circuit 13 or 13' is applied to a gate of each of the second type MOSFETs P51 and P53 and another end of the third capacitor C3. An inverter IN3 is connected between the output terminal of the output circuit 17 and a gate of the second type MOSFET P52.

First type MOSFETs N52 and N53 are connected in series between the second power supply VSS and the output terminal of the output circuit 17. A first type MOSFET N51 is also connected between the second power supply VSS and the output terminal of the output circuit 17. An end of a fourth capacitor C4 is connected with the output terminal of the output circuit 17. The signal Y3 output from the second path circuit 15 or 15' is applied to a gate4 of each of the first type MOSFETs N51 and N53 and another end of the fourth capacitor C4. An output signal of the inverter IN3 is applied to a gate of the first type MOSFET N52.

Figure 17:
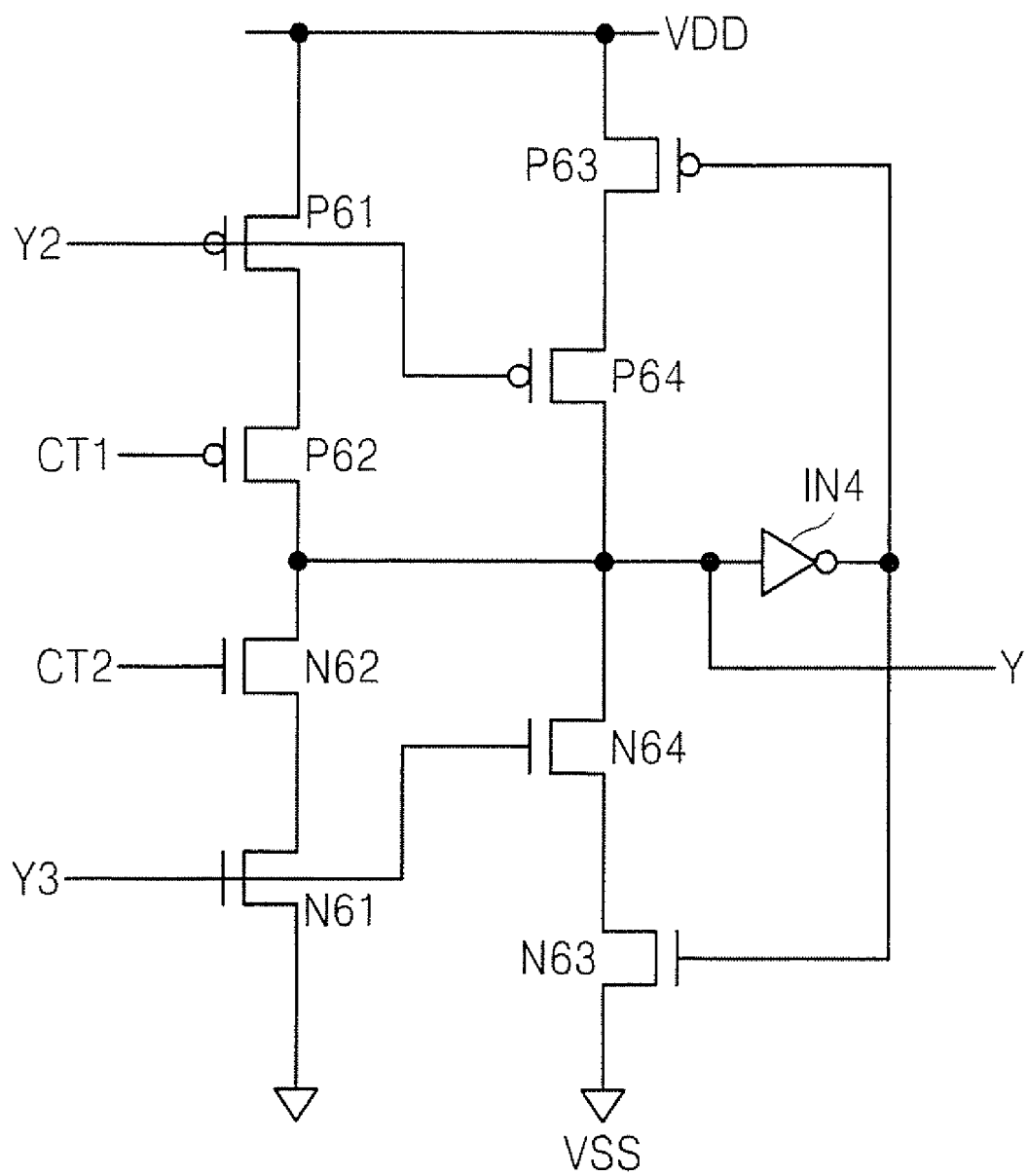
FIG. 17 is a diagram of the output circuit illustrated in FIG. 1 or 6, according to yet other embodiments of the present invention.

FIG. 17 is a diagram of the output circuit 17 illustrated in FIG. 1 or 6, according to yet other embodiments of the present invention. Referring to FIG. 17, second type MOSFETs P61 and P62 are connected in series between the first power supply VDD and the output terminal of the output circuit 17. First type MOSFETs N61 and N62 are connected in series between the second power supply VSS and the output terminal of the output circuit 17. Second type MOSFETs P63 and P64 are connected in series between the first power supply VDD and the output terminal of the output circuit 17. First type MOSFETs N63 and N64 are connected between the second power supply VSS and the output terminal of the output circuit 17. An inverter IN4 is connected between the output terminal of the output circuit 17 and a gate of the second type MOSFET P63.

The signal Y2 output from the first path circuit 13 or 13' is applied to a gate of each of the second type MOSFETs P61 and P64. The signal Y3 output from the second path circuit 15 or 15' is applied to a gate of each of the first type MOSFETs N61 and N64. Short pulses CT1 and CT2 are respectively applied to the MOSFETs P62 and N62 to charge or discharge the output terminal of the output circuit 17. The short pulses CT1 and CT2 may be non-overlap pulses. The short pulses CT1 and CT2 may have opposite phases except for a non-overlap period. The short pulses CT1 and CT2 may be generated by the control signal generator 19 illustrated in FIG. 1 or 6 or by another independent control signal generator. An output signal of the inverter IN4 may be applied to a gate of the first type MOSFET N63.

Figure 18:
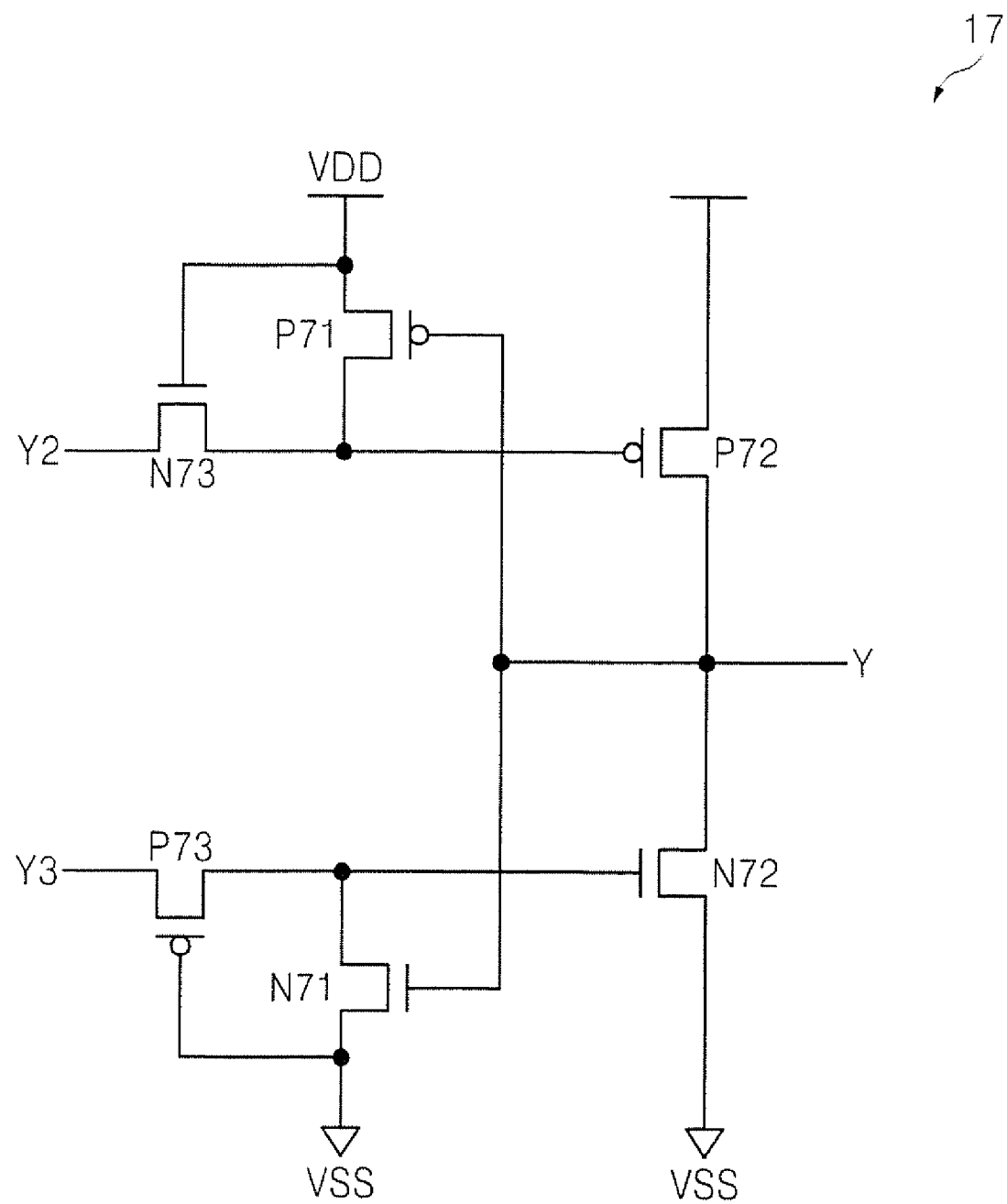
FIG. 18 is a diagram of the output circuit illustrated in FIG. 1 or 6, according to still other embodiments of the present invention.

FIG. 18 is a diagram of the output circuit 17 illustrated in FIG. 1 or 6, according to still other embodiments of the present invention. Referring to FIG. 18, a second type MOSFET P72 is connected between the first power supply VDD and the output terminal of the output circuit 17 and a first type MOSFET N72 is connected between the second power supply VSS and the output terminal of the output circuit 17. A second type MOSFET P71 is connected between the first power supply VDD and a gate of the second type MOSFET P72. The gate of the second type MOSFET P71 is connected with the output terminal of the output circuit 17. A first type MOSFET N73 has a gate connected with the first power supply VDD and transmits the signal Y2 output from the first path circuit 13 or 13' to the gate of the second type MOSFET P72 in response to a voltage of the first power supply VDD. A first type MOSFET N71 is connected between the second power supply VSS and a gate of the first type MOSFET N72. A gate of the first type MOSFET N71 is connected with the output terminal of the output circuit 17. A second type MOSFET P73 has a gate connected with the second power supply VSS and transmits the signal Y3 output from the second path circuit 15 or 15' to the gate of the first type MOSFET N72 in response to a voltage of the second power supply VSS.

For clarity of the description, the voltage of the first power supply VDD is referred to as VDD and the voltage of the second power supply VSS is referred to as VSS in describing the operation of the output circuit 17 below.

When the signals Y2 and Y3 are at a first level (e.g., a high level or VDD), a voltage of "VDD-Vthn" (where "Vthn" is a threshold voltage of the first type MOSFET N73) is applied to the gate of the second type MOSFET P72 and a voltage of "VDD-Vthp" (where "Vthp" is a threshold voltage of the second type MOSFET P73) is applied to the gate of the first type MOSFET N72. Then, the first type MOSFET N72 is turned on and the voltage Y of the output terminal of the output circuit 17 is pulled down to VSS. However, leakage current occurs at the second type MOSFET P72 due to the voltage of "VDD-Vthn". The second type MOSFET P71 is turned on in response to the voltage Y (=VSS) of the output terminal, and therefore, VDD is applied to the gate of the second type MOSFET P72. As a result, a voltage applied to the gate of the second type MOSFET P72 increases from "VDD-Vthn" to VDD and the second type MOSFET P72 is completely turned off. Accordingly, the leakage current in the second type MOSFET P72 is mostly blocked, and therefore, static power generated at the second type MOSFET P72 by the leakage current can be mostly eliminated.

Contrarily, when the signals Y2 and Y3 are at a second level (e.g., a low level or VSS), Vthn, i.e., the threshold voltage of the first type MOSFET N73 is applied to the gate of the second type MOSFET P72 and Vthp, i.e., the threshold voltage of the second type MOSFET P73 is applied to the gate of the first type MOSFET N72. The second type MOSFET P72 is turned on in response to the output signal Y2 of the first path circuit 13 or 13', which is transmitted through the first type MOSFET N73, and the first type MOSFET N72 is turned on in response to the output signal Y3 of the second path circuit 15 or 15', which is transmitted through the second type MOSFET P73. At this time, small leakage current occurs in the first type MOSFET N72. Accordingly, the voltage of the output terminal of the output circuit 17 is pulled up to VDD, and therefore, the second type MOSFET P71 is turned off and the first type MOSFET N71 is turned on. As a result, VSS is applied to the gate of the first type MOSFET N72. In other words, the voltage applied to the gate of the first type MOSFET N72 is pulled from "Vthp" down to VSS. So, the first type MOSFET N72 is completely turned off in response to VSS. As a result, the leakage current in the first type MOSFET N72 is mostly blocked, and therefore, static power generated in the first type MOSFET N72 by the leakage current can be mostly eliminated.

In other words, in the output circuit 17 having a structure illustrated in FIG. 18, a voltage applied to the second type MOSFET P72 is pulled from a voltage lower than VDD up to VDD over time. In addition, a voltage applied to the first type MOSFET N72 is pulled from a voltage higher than VSS down to VSS over time. Accordingly, leakage current in the second type MOSFET P72 or the first type MOSFET N72 is quickly blocked and static current caused by the leakage current in the second type MOSFET P72 or the first type MOSFET N72 is also mostly blocked.

Figure 19:
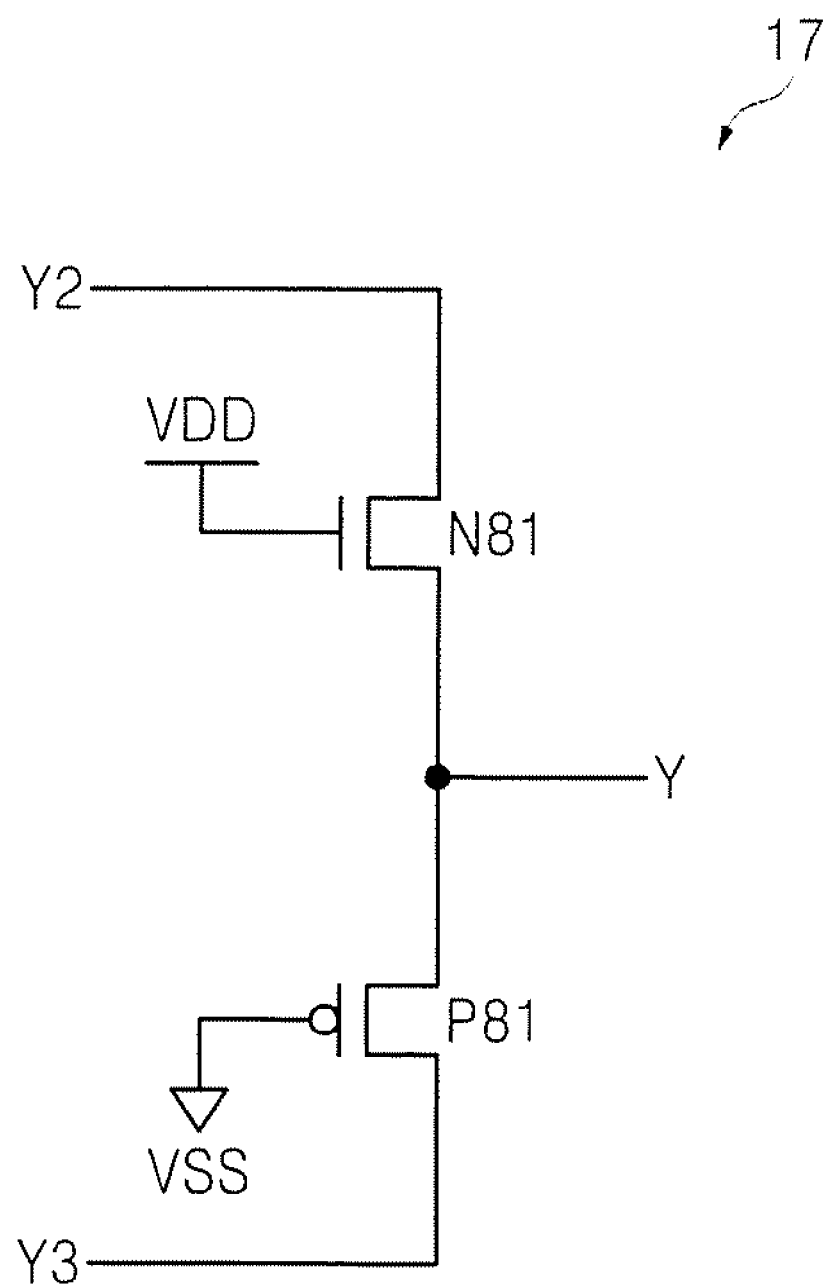
FIG. 19 is a diagram of the output circuit illustrated in FIG. 1 or 6, according to further embodiments of the present invention.

FIG. 19 is a diagram of the output circuit 17 illustrated in FIG. 1 or 6, according to further embodiments of the present invention. Referring to FIG. 19, MOSFETs N81 and P81 are connected in series between a line transmitting the output signal Y2 of the first path circuit 13 or 13' and a line transmitting the output signal Y3 of the second path circuit 15 or 15'. The output terminal of the output circuit 17 is connected with a common node of the MOSFETs N81 and P81. A gate of the first type MOSFET N81 is connected with the first power supply VDD and a gate of the second type MOSFET P81 is connected with the second power supply VSS.

The output circuit 17 illustrated in each of FIGS. 10 through 19 has a small swing width for low power consumption and high-speed operation.

Figure 20:
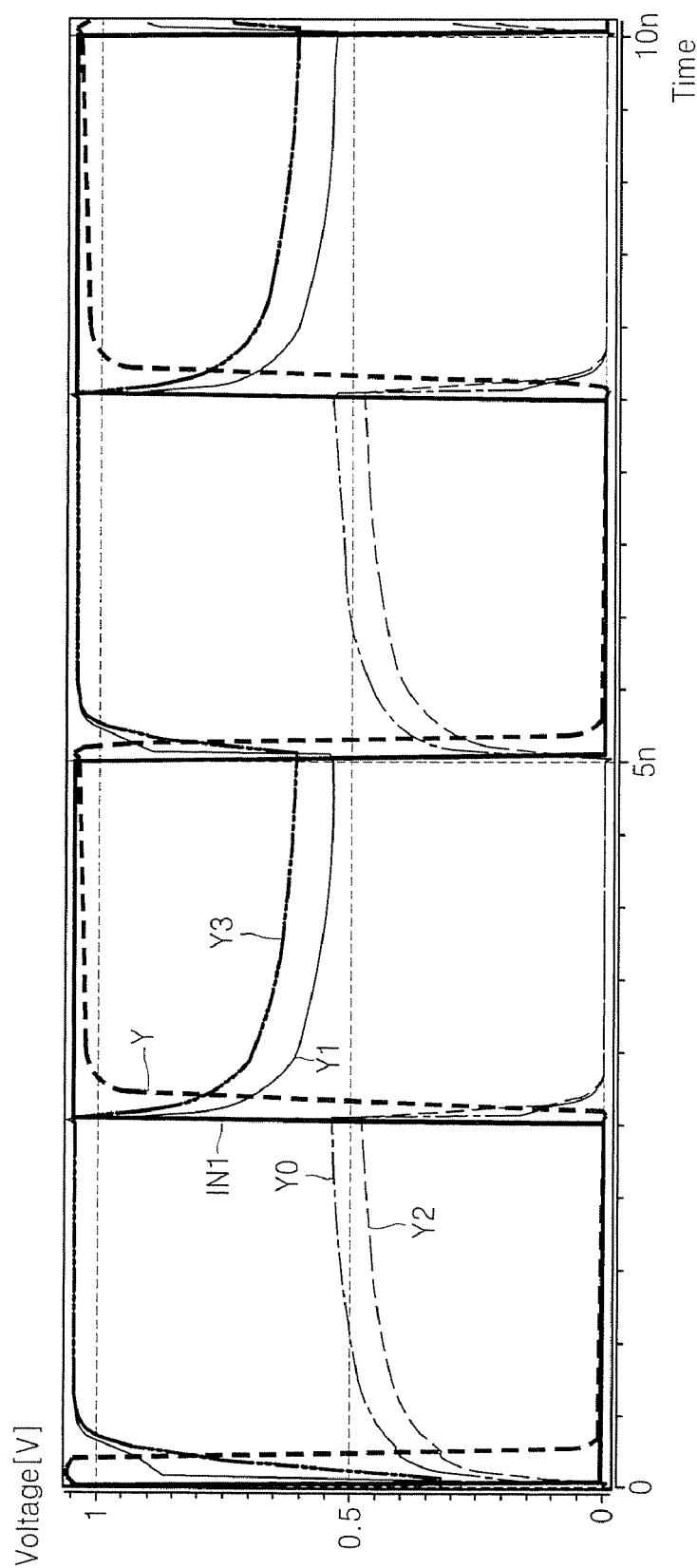
FIG. 20 is a waveform diagram of signals output from multiple stage multiplexers included in a multiplexer including the output circuit illustrated in FIG. 10.

FIG. 20 is a waveform diagram of signals output from multiple stage multiplexers included in a multiplexer including the output circuit 17 illustrated in FIG. 10. Referring to FIGS. 2, 7, 10, and 20, since a data path is divided into a first path including the first path circuit 13 or 13' and a second path including the second path circuit 15 or 15', a voltage swing width of the signals Y0, Y1, Y2, and Y3 respectively output from the multiple stage multiplexers 20, 24, 22, and 26 is reduced. The reduction of the voltage swing width brings the increase of data transmission speed and the decrease of power consumption in the multiplexer 10 or 10'. Here, "Y0" denotes the group of the signals Y0-1 through Y0-16, "Y1" denotes the group of the signals Y1-1 through Y1-16. "IN1" denotes an input data signal, and "Y" denotes an output data signal of the multiplexer.

Figure 21:
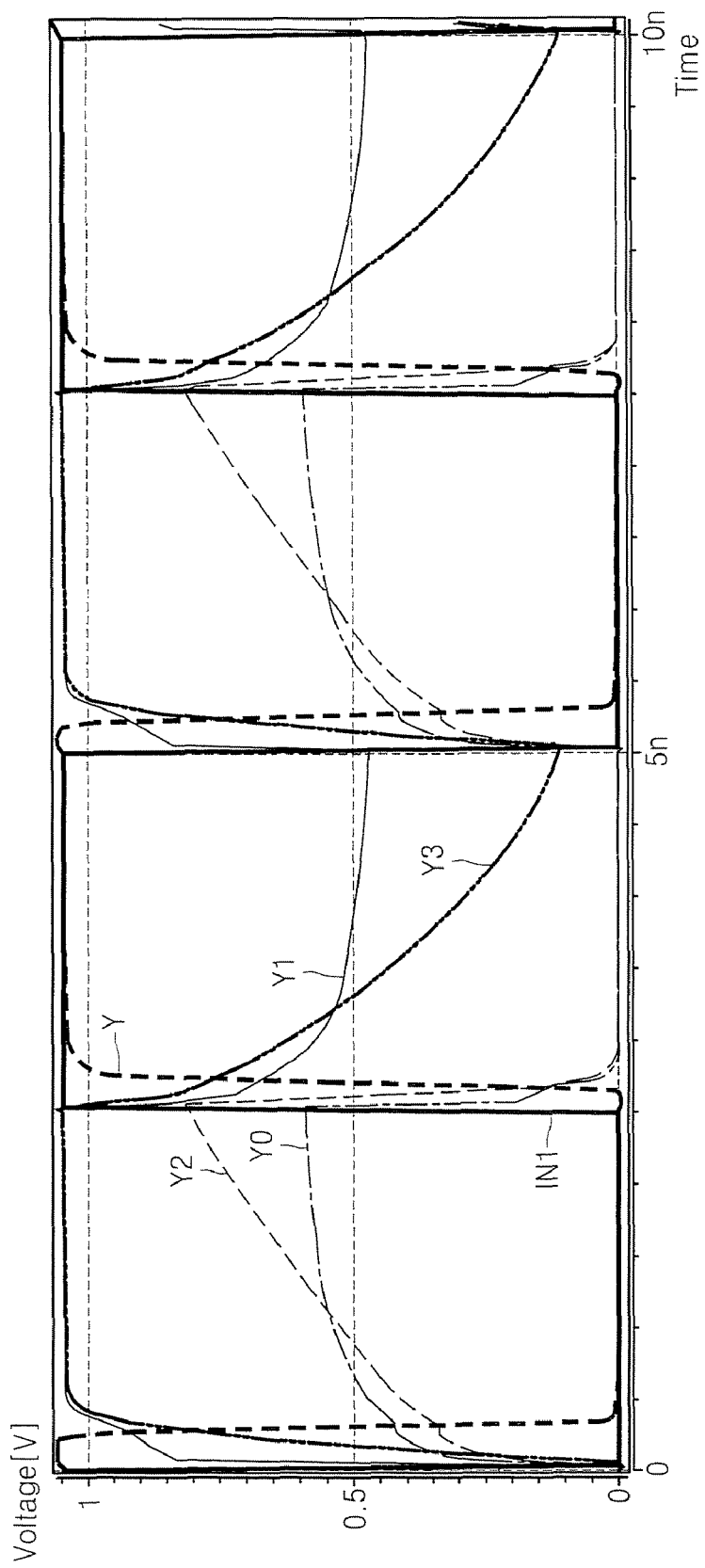
FIG. 21 is a waveform diagram of signals output from multiple stage multiplexers included in a multiplexer including the output circuit illustrated in FIG. 11.

FIG. 21 is a waveform diagram of signals output from multiple stage multiplexers included in a multiplexer including the output circuit 17 illustrated in FIG. 11. Referring to FIGS. 2, 7, 11, and 21, since a data path is divided into a first path including the first path circuit 13 or 13' and a second path including the second path circuit 15 or 15', a voltage swing width of the signals Y0, Y1, Y2, and Y3 respectively output from the multiple stage multiplexers 20, 22, 24, 26, 30, 32 is reduced. The reduction of the voltage swing width brings the increase of data transmission speed and the decrease of power consumption in the multiplexer. Here, "Y0" denotes the group of the signals Y0-1 through Y0-16. "Y1" denotes the group of the signals Y1-1 through Y1-16, "IN1" denotes an input data signal, and "Y" denotes an output data signal of the multiplexer.

Referring to FIG. 20, since the signals Y0, Y1, Y2, and Y3 output from the multiple stage multiplexers 20, 22, 24, 26, 30, and 32 are not full-swing signals, the multiplexer according to some embodiments of the present invention has an improved operating speed.

It is seen that the voltage swing width of the signals Y0, Y1, Y2, and Y3 shown in FIG. 21 is larger than that of the signals Y0, Y1, Y2, and Y3 shown in FIG. 20. Referring to FIG. 21, since the signals Y0, Y1, Y2, and Y3 output from the multiple stage multiplexers 20 or 30, 24 or 32, 22, and 26 are not full-swing signals, the multiplexer according to some embodiments of the present invention has an improved operating speed. As shown in FIGS. 20 and 21, a delay between the input data signal IN1 and the output data signal Y is decreased from 300 picoseconds (ps) to 140 ps.

Figure 22:
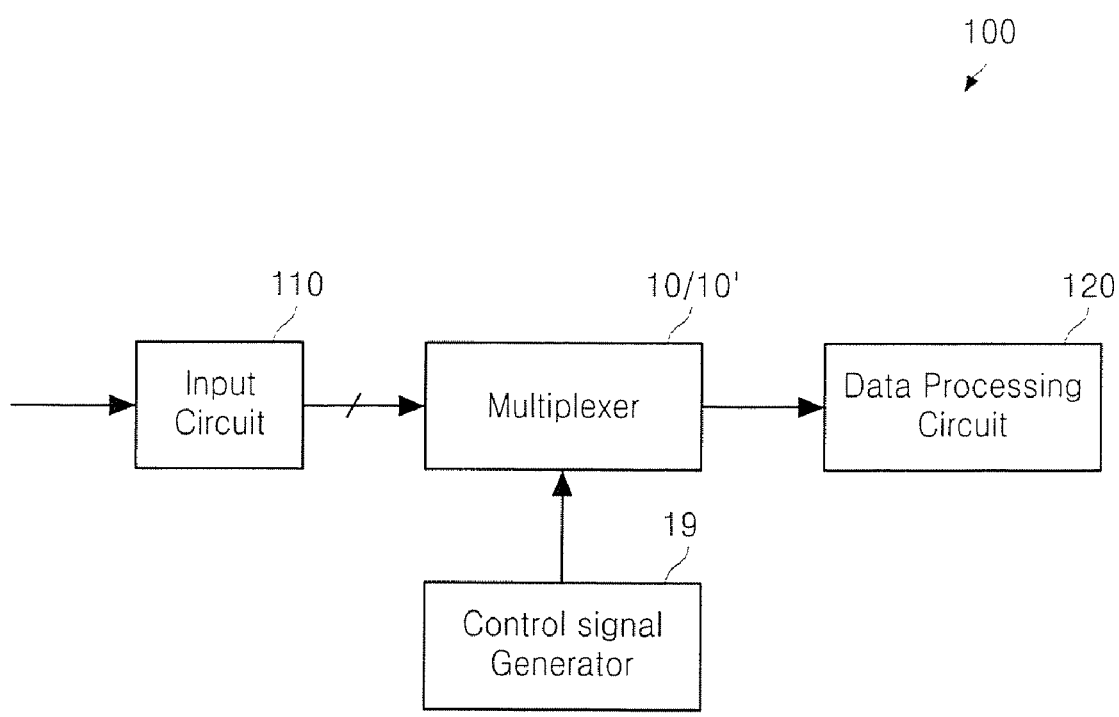
FIG. 22 is a block diagram of a semiconductor device including the multiplexer illustrated in FIG. 1 or 6.

FIG. 22 is a block diagram of a semiconductor device 100 including the multiplexer 10 or 10' illustrated in FIG. 1 or 6. Referring to FIG. 22, the semiconductor device 100 may be any data processing device that can process data signals, for example, a CPU, a DSP, a video/audio chip, an ASIC, a SOC, an MP3 audio chip, a wireless audio chip, an audio codec chip, an MPEG4 codec chip, an h264 codec chip, a video codec chip, a codec chip, or a voice codec chip. In addition, the semiconductor device 100 may be any data processing device that operates at high speed with low power consumption. The semiconductor device 100 may be implemented by a semiconductor chip.

The semiconductor device 100 includes a data input circuit 110, the multiplexer 10 or 10', a data processing circuit 120, and the control signal generator 19. The data input circuit 110 transmits data signals, which are input from an outside of the semiconductor device 100 or generated within the semiconductor device 100, to the multiplexer 10 or 10'. The multiplexer 10 or 10' multiplexes the data signals from the data input circuit 110 in response to at least one control signal output from the control signal generator 19 and transmits at least one multiplexed signal to the data processing circuit 120. The data processing circuit 120 performs various operations, e.g., buffering, writing, reading, encoding, decoding, image processing, level-up operation, level-down operation, and format conversion, on the signal output from the multiplexer 10 or 10'.

Figure 23:
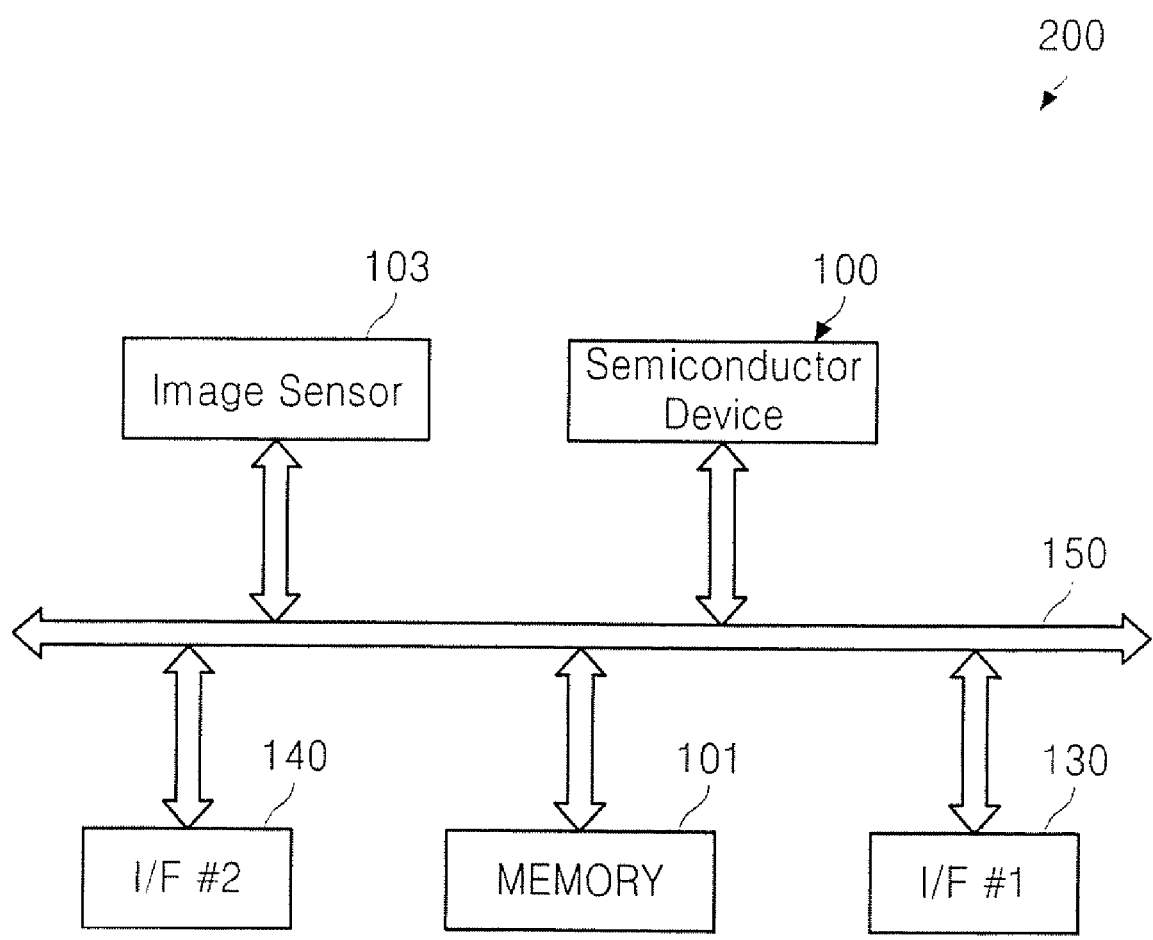
FIG. 23 is a block diagram of an electronic device including the semiconductor device illustrated in FIG. 22.

FIG. 23 is a block diagram of an electronic device 200 including the semiconductor device 100 illustrated in FIG. 22. Referring to FIG. 22, the electronic device 200 includes a memory device 101 connected with a system bus 150 and the semiconductor device 100. The semiconductor device 100 may be implemented by a CPU, a DSP, a video/audio chip, an ASIC, a SOC, an MP3 audio chip, a wireless audio chip, an audio codec chip, an MPEG4 codec chip, an h264 codec chip, a video codec chip, a codec chip, or a voice codec chip. The semiconductor device 100 may control the writing, reading and verification reading operations of the memory device 101. For instance, the semiconductor device 100 may communicate data with an external device through an input/output interface (I/F), i.e., a first I/F 130. The semiconductor device 100 may communicate data with an image sensor 103 through the system bus 150. In addition, the semiconductor device 100 may communicate data with an external wireless device through a wireless I/F, i.e., a second I/F 140 via wireless connection.

When the electronic device 200 is implemented by a portable application, the electronic device 200 may additionally include a battery (not shown) which supply power to the memory device 101 and the semiconductor device 100. The portable application may be a portable computer, a digital camera, a personal digital assistant (PDA), a cellular phone, an MP3 player, a portable multimedia player (PMP), an automotive navigation system, a memory card, a smart card, a game machine, an electronic dictionary, an electronic instrument, a solid state disc, or a solid state drive.

The electronic device 200 may include the first I/F 130 to communicate data with an external data processing device. When the electronic device 200 is a wireless system, the electronic device 200 may include the semiconductor device 100, the memory device 101, and the wireless I/F 140. At this time, the wireless I/F 140 connected with the semiconductor device 100 through the system bus 150 may communicate data with an external wireless device (not shown) via wireless connection. For instance, the semiconductor device 100 may process data input through the wireless I/F 140 and store the processed data in the memory device 101. The semiconductor device 100 may also read data from the memory device 101 and transmit the data to the wireless I/F 140. The memory device 101 may include volatile memory, e.g., dynamic random access memory (DRAM) or static random access memory (SRAM), or non-volatile memory. In addition, the memory device 101 may be a hard disc drive that magnetically stores data. The memory device 101 may also be a hybrid hard disc drive. The wireless system may be a PDA, a portable computer, a wireless telephone, a pager, a radio frequency identification (RFID) reader, or an RFID system. The wireless system may also be a wireless local area network (WLAN) system or a wireless personal area network (WPAN) system. The wireless system may be a cellular network.

When the electronic device 200 is an image pickup device, the electronic device 200 may include the image sensor 103 which converts an optical signal into an electrical signal. The image sensor 103 may be an image sensor using a charge-coupled device (CCD) or an image sensor manufactured using a complementary metal-oxide semiconductor (CMOS) process. At this time, the electronic device 200 may be a digital camera, a mobile phone equipped with a digital camera, or a satellite equipped with a camera.

Although the output circuit 17 has been described to be implemented using a MOSFET in embodiments of the present invention, it is apparent that the output circuit 17 may be implemented using a bipolar junction transistor (BJT). In addition, each MOSFET Nx or Px (where "x" is a natural number) illustrated in FIGS. 9 through 19 may be replaced by a transistor or a switch that can be classified into either of two different types.

According to some embodiments of the present invention, a multiplexer having separate data paths can process data at high speed with low power consumption. In addition, a semiconductor device including the multiplexer and an electronic device including the semiconductor device can also process data at high speed with low power consumption. Thus, as described above, integrated circuit devices according to embodiments of the present invention include high speed multiplexers 10. Some of these multiplexers 10 include a first N-to-1 selection circuit 13, where N is an integer greater than one, a second N-to-1 selection circuit 15 and an output driver 17. The first N-to-1 selection circuit 13 is configured to route a true or complementary version of a selected first input signal (from IN1-IN48) to an output 42 thereof in response to a first multi-bit selection signal (SW1-i, SW2-j), where N is an integer greater than one (e.g., N=48). Similarly, the second N-to-1 selection circuit 15 is configured to route a true or complementary version of the selected first input signal to an output 43 thereof in response to a second multi-bit selection signal (SW1B-i, SW2B-j). The output driver 17 includes a pull-up circuit, which is responsive to a signal 42 generated at the output of the first N-to-1 selection circuit 13, and a pull-down circuit, which is responsive to a signal 43 generated at the output of the second N-to-1 selection circuit 15.

According to the embodiment of FIG. 10, the pull-up circuit 17-1 includes a first PMOS pull-up transistor P1 having a gate terminal responsive to the signal 42 generated at the output of the first N-to-1 selection circuit 13. In addition, the pull-down circuit 17-2 includes a first NMOS pull-down transistor N1 having a gate terminal responsive to the signal 43 generated at the output of the second N-to-1 selection circuit 15. In some of these embodiments of the invention, the first N-to-1 selection circuit 13 is configured to route the true or complementary version of the selected first input signal through at least one NMOS selection transistor (see, e.g., FIGS. 3 and 6), and the second N-to-1 selection circuit 15 is configured to route the true or complementary version of the selected first input signal through at least one PMOS selection transistor (see, e.g., FIGS. 5-6).

The pull-up circuit 17-1 may include a second PMOS pull-up transistor P2, which has a source terminal electrically coupled to a drain terminal of the first PMOS pull-up transistor P1, and an NMOS node discharge transistor N3. This NMOS node discharge transistor N3 has a drain terminal electrically coupled to the source terminal of the second PMOS pull-up transistor P2 and a gate terminal electrically connected to gate terminals of the first and second PMOS pull-up transistors P1-P2. According to the embodiment of FIG. 11, pull-up circuit 17-3 includes a PMOS node charging transistor P12 having a gate terminal electrically connected to an output Y of the output driver 17 and a drain terminal electrically connected to the gate terminal of the first PMOS pull-up transistor P1. According to these embodiments of the invention, the pull-down circuit 17-4 may also include an NMOS node discharging transistor N12 having a gate terminal electrically connected to an output of the output driver 17 and a drain terminal electrically connected to the gate terminal of the first NMOS pull-down transistor N1.

According to the embodiment of FIG. 13, the pull-up circuit includes a second PMOS pull-up transistor P32 having a source terminal electrically coupled to a drain terminal of the first PMOS pull-up transistor P31 and a gate terminal electrically connected to the gate terminal of the first PMOS pull-up transistor P31. A PMOS node discharge transistor P33 is provided, which has a source terminal electrically connected to the source terminal of the second PMOS pull-up transistor P32 and a gate terminal electrically connected to an output Y of the output driver 17. An NMOS node charging transistor N33 is also provided, which has a source terminal electrically connected to a drain terminal of the first NMOS pull-down transistor N31 and a gate terminal electrically connected to the output Y of the output driver 17.

In the embodiment of FIG. 15, the pull-up circuit includes a second PMOS pull-up transistor P43 having a source terminal electrically coupled to a drain terminal of the first PMOS pull-up transistor P41 and a gate terminal electrically connected to the gate terminal of the first PMOS pull-up transistor P41. A third PMOS pull-up transistor P42 is also provided, which has a source terminal electrically connected to the source terminal of the first PMOS pull-up transistor P41 and a drain terminal electrically connected to the drain terminal of the first PMOS pull-up transistor P41. A first capacitor C1 is provided, which has a first electrode electrically connected to the gate terminals of the first and second PMOS pull-up transistors P41, P43 and a second electrode electrically connected to the drain terminal of the first PMOS pull-up transistor P41. A latching inverter IN2 is further provided, which has an input electrically coupled to an output of the output driver and an output electrically connected to a gate terminal of the third PMOS pull-up transistor P42. The pull-down circuit may further include a second NMOS pull-down transistor P43 having a source terminal electrically coupled to a drain terminal of the first NMOS pull-down transistor N41 and a gate terminal electrically connected to the gate terminal of the first NMOS pull-down transistor N41. A third NMOS pull-down transistor N42 having a drain terminal electrically connected to the drain terminal of the first NMOS pull-down transistor N41 and a gate terminal electrically connected to the output of said latching inverter IN2. This pull-down circuit further includes a second capacitor C2 having a first electrode electrically connected to the gate terminals of the first and second NMOS pull-down transistors N41, N43 and a second electrode electrically connected to the drain terminal of the first NMOS pull-down transistor N41. In some of these embodiments of the invention, the second electrode of the first capacitor C1 is electrically connected to the drain terminal of the third PMOS pull-up transistor P42 and the second electrode of the second capacitor C2 is electrically connected to the drain terminal of the third NMOS pull-down transistor N42.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A multiplexer, comprising:
 a first N-to-1 selection circuit configured to route a true or complementary version of a selected first input signal to an output thereof in response to a first multi-bit selection signal, where N is an integer greater than one;
 a second N-to-1 selection circuit configured to route a true or complementary version of the selected first input signal to an output thereof in response to a second multi-bit selection signal; and
 an output driver comprising a pull-up circuit responsive to a signal generated at the output of said first N-to-1 selection circuit and a pull-down circuit responsive to a signal generated at the output of said second N-to-1 selection circuit;

wherein said pull-down circuit comprises a first NMOS pull-down transistor having a gate terminal responsive to the signal generated at the output of said second N-to-1 selection circuit; and
wherein said pull-up circuit comprises:
  a first PMOS pull-up transistor having a gate terminal responsive to the signal generated at the output of said first N-to-1 selection circuit;
  a second PMOS pull-up transistor having a source terminal electrically coupled to a drain terminal of the first PMOS pull-up transistor; and
  an NMOS node discharge transistor having a drain terminal electrically coupled to the source terminal of the second PMOS pull-up transistor and a gate terminal electrically connected to gate terminals of the first and second PMOS pull-up transistors.

2. The multiplexer of claim 1, wherein said first N-to-1 selection circuit is configured to route the true or complementary version of the selected first input signal through at least one NMOS selection transistor; and wherein said second N-to-1 selection circuit is configured to route the true or complementary version of the selected first input signal through at least one PMOS selection transistor.

3. A multiplexer, comprising:
  a first N-to-1 selection circuit configured to route a true or complementary version of a selected first input signal to an output thereof in response to a first multi-bit selection signal, where N is an integer greater than one;
  a second N-to-1 selection circuit configured to route a true or complementary version of the selected first input signal to an output thereof in response to a second multi-bit selection signal; and
  an output driver comprising a pull-up circuit responsive to a signal generated at the output of said first N-to-1 selection circuit and a pull-down circuit responsive to a signal generated at the output of said second N-to-1 selection circuit;
  wherein said pull-down circuit comprises a first NMOS pull-down transistor having a gate terminal responsive to the signal generated at the output of said second N-to-1 selection circuit; and
  wherein said pull-up circuit comprises:
    a first PMOS pull-up transistor having a gate terminal responsive to the signal generated at the output of said first N-to-1 selection circuit;
    a PMOS node charging transistor having a gate terminal electrically connected to an output of said output driver and a drain terminal electrically connected to the gate terminal of the first PMOS pull-up transistor.

4. The multiplexer of claim 3, wherein said pull-down circuit further comprises:
  an NMOS node discharging transistor having a gate terminal electrically connected to an output of said output driver and a drain terminal electrically connected to the gate terminal of the first NMOS pull-down transistor.

5. A multiplexer, comprising:
  a first N-to-1 selection circuit configured to route a true or complementary version of a selected first input signal to an output thereof in response to a first multi-bit selection signal, where N is an integer greater than one;
  a second N-to-1 selection circuit configured to route a true or complementary version of the selected first input signal to an output thereof in response to a second multi-bit selection signal; and
  an output driver comprising a pull-up circuit responsive to a signal generated at the output of said first N-to-1 selection circuit and a pull-down circuit responsive to a signal generated at the output of said second N-to-1 selection circuit;
  wherein said pull-down circuit comprises a first NMOS pull-down transistor having a gate terminal responsive to the signal generated at the output of said second N-to-1 selection circuit; and
  wherein said pull-up circuit comprises:
    a first PMOS pull-up transistor having a gate terminal responsive to the signal generated at the output of said first N-to-1 selection circuit;
    a second PMOS pull-up transistor having a source terminal electrically coupled to a drain terminal of the first PMOS pull-up transistor and a gate terminal electrically connected to the gate terminal of the first PMOS pull-up transistor; and
    a PMOS node discharge transistor having a source terminal electrically connected to the source terminal of the second PMOS pull-up transistor and a gate terminal electrically connected to an output of said output driver.

6. The multiplexer of claim 5, further comprising an NMOS node charging transistor having a source terminal electrically connected to a drain terminal of the first NMOS pull-down transistor and a gate terminal electrically connected to the output of said output driver.

7. A multiplexer, comprising:
  a first N-to-1 selection circuit configured to route a true or complementary version of a selected first input signal to an output thereof in response to a first multi-bit selection si where N is an integer greater than one;
  a second N-to-1 selection circuit configured to route a true or complementary version of the selected first input signal to an output thereof in response to a second multi-bit selection signal; and
  an output driver comprising a pull-up circuit responsive to a signal generated at the output of said first N-to-1 selection circuit and a pull-down circuit responsive to a signal generated at the output of said second N-to-1 selection circuit;
  wherein said pull-down circuit comprises a first NMOS pull-down transistor having a gate terminal responsive to signal generated at the output of said second N-to-1 selection circuit; and
  wherein said pull-up circuit comprises:
    a first PMOS pull-up transistor having a gate terminal responsive to the signal generated at the output of said first N-to-1 selection circuit;
    a second PMOS pull-up transistor having a source terminal electrically coupled to a drain terminal of the first PMOS pull-up transistor and a gate terminal electrically connected to the gate terminal of the first PMOS pull-up transistor;
    a third PMOS pull-up transistor having a source terminal electrically connected to the source terminal of the first PMOS pull-up transistor and a drain terminal electrically connected to the drain terminal of the first PMOS pull-up transistor; and
    a first capacitor having a first electrode electrically connected to the gate terminals of the first and second PMOS pull-up transistors and a second electrode electrically connected to the drain terminal of the first PMOS pull-up transistor.

8. The multiplexer of claim 7, further comprising a latching inverter having an input electrically coupled to an output of said output driver and an output electrically connected to a gate terminal of said third PMOS pull-up transistor.

9. The multiplexer of claim 8, wherein said pull-down circuit further comprises:
- a second NMOS pull-down transistor having a source terminal electrically coupled to a drain terminal of the first NMOS pull-down transistor and a gate terminal electrically connected to the gate terminal of the first NMOS pull-down transistor; and
- a third NMOS pull-down transistor having a drain terminal electrically connected to the drain terminal of the first NMOS pull-down transistor and a gate terminal electrically connected to the output of said latching inverter.

10. The multiplexer of claim 9, wherein said pull-down circuit further comprises a second capacitor having a first electrode electrically connected to the gate terminals of the first and second NMOS pull-down transistors and a second electrode electrically connected to the drain terminal of the first NMOS pull-down transistor.

11. The multiplexer of claim 10, wherein the second electrode of said first capacitor is electrically connected to the drain terminal of the third PMOS pull-up transistor; and wherein the second electrode of said second capacitor is electrically connected to the drain terminal of the third NMOS pull-down transistor.

12. A multiplexer, comprising:
- a first N-to-1 selection circuit configured to route a true or complementary version of a selected first input signal to an output thereof in response to a first multi-bit selection signal, where N is an integer greater than one;
- a second N-to-1 selection circuit configured to route a true or complementary version of the selected first input signal to an output thereof in response to a second multi-bit selection signal; and
- an output driver comprising a pull-up circuit responsive to a signal generated at the output of said first N-to-1 selection circuit and a pull-down circuit responsive to a signal generated at the output of said second N-to-1 selection circuit;
- wherein said pull-down circuit comprises a first NMOS pull-down transistor having a gate terminal responsive to the signal generated at the output of said second N-to-1 selection circuit; and
- wherein said pull-up circuit comprises:
  - a first PMOS pull-up transistor having a gate terminal responsive to the signal generated at the output of said first N-to-1 selection circuit;
  - a second PMOS pull-up transistor having a gate terminal electrically connected to the gate terminal of the first PMOS pull-up transistor and a drain terminal electrically connected to a drain terminal of the first PMOS pull-up transistor; and
  - a third PMOS pull-up transistor having a drain terminal electrically coupled to a source terminal of the second PMOS pull-up transistor.

13. The multiplexer of claim 12, further comprising a latching inverter having an input electrically connected to the drain terminals of the first and second PMOS pull-up transistors and an output electrically connected to a gate terminal of the third PMOS pull-up transistor.

14. The multiplexer of claim 12, further comprising a capacitor having a first terminal electrically connected to the gate terminals of the first and second PMOS pull-up transistors and a second terminal electrically connected to the drain terminals of the first and second PMOS pull-up transistors.

15. A multiplexer comprising:
- a first path circuit configured to transmit one signal among a plurality of input signals as a first transmission signal using a plurality of first type pass transistors;
- a second path circuit configured to transmit one signal among the plurality of input signals as a second transmission signal using a plurality of second type pass transistors; and
- an output circuit configured to output one of two voltages as an output signal in response to the first transmission signal and the second transmission signal.

16. The multiplexer of claim 15, wherein each of the first type pass transistors is one among an N-type metal-oxide semiconductor field effect transistor (NMOSFET) and a P-type metal-oxide semiconductor field effect transistor (PMOSFET) and each of the second type pass transistors is the other one among the NMOSFET and the PMOSFET.

17. The multiplexer of claim 15, wherein the first path circuit comprises:
- a plurality of first type first stage multiplexers each comprising some of the plurality of first type pass transistors, each of the first type first stage multiplexers outputting one signal among some of the input signals in response to a plurality of first control signals; and
- a first type second stage multiplexer comprising the rest of the plurality of first type pass transistors connected with the plurality of first type first stage multiplexers, the first type second stage multiplexer outputting one signal among signals output from the plurality of first type first stage multiplexers as the first transmission signal in response to a plurality of second control signals.

18. The multiplexer of claim 15, wherein the second path circuit comprises:
- a plurality of second type first stage multiplexers, each comprising some of the plurality of second type pass transistors, each of the second type first stage multiplexers outputting one signal among some of the input signals in response to a plurality of first control signals; and
- a second type second stage multiplexer comprising the rest of the plurality of second type pass transistors connected with the plurality of second type first stage multiplexers, the second type second stage multiplexer outputting one signal among signals output from the plurality of second type first stage multiplexers as the second transmission signal in response to a plurality of second control signals.

19. The multiplexer of claim 15, wherein the output circuit comprises:
- a second type transistor configured to output one of the two voltages as the output signal in response to the first transmission signal; and
- a first type transistor configured to output the other one of the two voltages as the output signal in response to the second transmission signal.

20. The multiplexer of claim 15, wherein the output circuit comprises:
- a plurality of second type transistors connected in series between a first terminal supplying one of the two voltages and an output terminal of the output circuit and gated in response to the first transmission signal;
- a plurality of first type transistors connected in series between the output terminal of the output circuit and a second terminal supplying the other of the two voltages and gated in response to the second transmission signal;
- a first type transistor connected between a common node of the plurality of second type transistors and the second terminal and gated in response to the first transmission signal; and a second type transistor connected between a common node of the plurality of first type transistors and the first terminal and gated in response to the second transmission signal.

21. The multiplexer of claim 15, wherein the output circuit comprises:
a plurality of second type first transistors connected in series between a first terminal supplying one of the two voltages and an output terminal of the output circuit and gated in response to the first transmission signal;
a plurality of first type first transistors connected in series between the output terminal of the output circuit and a second terminal supplying the other of the two voltages and gated in response to the second transmission signal;
a plurality of second type second transistors connected in series between an output terminal of the first path circuit and the first terminal, each of the second type second transistors having a gate connected with the output terminal of the output circuit; and
a plurality of first type second transistors connected in series between an output terminal of the second path circuit and the second terminal, each of the first type second transistors having a gate connected with the output terminal of the output circuit.

22. The multiplexer of claim 15, wherein the output circuit comprises:
a plurality of second type transistors connected in series between a first terminal supplying one of the two voltages and an output terminal of the output circuit and gated in response to the first transmission signal; and
a plurality of first type transistors connected in series between the output terminal of the output circuit and a second terminal supplying the other of the two voltages and gated in response to the second transmission signal.

23. The multiplexer of claim 22, wherein the output circuit further comprises:
a second type transistor connected between a common node of the plurality of second type transistors and the second terminal and gated in response to the output signal; and
a first type transistor connected between a common node of the plurality of first type transistors and the first terminal and gated in response to the output signal.

24. The multiplexer of claim 15, wherein the output circuit comprises:
a plurality of second type transistors connected in series between a first terminal supplying one of the two voltages and an output terminal of the output circuit;
a plurality of first type transistors connected in series between the output terminal of the output circuit and a second terminal supplying the other of the two voltages; and
an inverter at the output terminal of the output circuit,
a signal output from the inverter is input to a gate of one of the second type transistors and a gate of one of the first type transistors, and
the first transmission signal is input to a gate of another one of the second type transistors and the second transmission signal is input to a gate of another one of the first type transistors.

25. The multiplexer of claim 24, wherein the output circuit further comprises:
a first capacitor connected between an output terminal of the first path circuit and a first common node of the second type transistors;
a second capacitor connected between an output terminal of the second path circuit and a second common node of the first type transistors;
a second type transistor connected between the first terminal and the first common node and gated in response to the first transmission signal; and
a first type transistor connected between the second terminal and the second common node and gated in response to the second transmission signal.

26. The multiplexer of claim 24, wherein the output circuit further comprises:
a second type transistor connected between the output terminal of the output circuit and the first terminal and gated in response to the first transmission signal;
a first type transistor connected between the output terminal of the output circuit and the second terminal and gated in response to the second transmission signal;
a first capacitor connected between an output terminal of the first path circuit outputting the first transmission signal and the output terminal of the output circuit; and
a second capacitor connected between an output terminal of the second path circuit outputting the second transmission signal and the output terminal of the output circuit.

27. The multiplexer of claim 24, wherein the output circuit further comprises:
a plurality of second type second transistors connected in series between the first terminal and the output terminal of the output circuit; and
a plurality of first type second transistors connected in series between the output terminal of the output circuit and the second terminal,
one among the second type second transistors is gated in response to the first transmission signal and another one among the second type second transistors is gated in response to a first control signal, and
one among the first type second transistors is gated in response to the second transmission signal and another one among the first type second transistors is gated in response to a second control signal.

28. The multiplexer of claim 15, wherein the output circuit comprises:
a first pull-up circuit configured to output a first voltage among the two voltages as the output signal in response to the first transmission signal;
a first pull-down circuit configured to output a second voltage among the two voltages as the output signal in response to the second transmission signal;
a second pull-up circuit configured to pull up a level of the first transmission signal according to the output signal; and
a second pull-down circuit configured to pull down a level of the second transmission signal according to the output signal.

29. The multiplexer of claim 28, wherein the second pull-up circuit comprises:
a first type first transistor connected between an output terminal of the first path circuit and an input terminal of the first pull-up circuit and gated in response to the first voltage; and
a second type first transistor connected between a first terminal outputting the first voltage and the input terminal of the first pull-up circuit and gated in response to the output signal, and
wherein the second pull-down circuit comprises:
a second type second transistor connected between an output terminal of the second path circuit and an input terminal of the first pull-down circuit and gated in response to the second voltage; and a first type second transistor connected between a second terminal outputting the second voltage and the input terminal of the first pull-down circuit and gated in response to the output signal.

30. The multiplexer of claim 15, wherein the output circuit comprises:
a first transmission circuit configured to output the first transmission signal as the output signal in response to one of the two voltages; and
a second transmission circuit configured to output the second transmission signal as the output signal in response to the other of the two voltages.

31. A semiconductor device comprising:
a data input circuit configured to output a plurality of input signals; and
a multiplexer configured to output one signal among the input signals as an output signal,
wherein the multiplexer comprises:
a first path circuit configured to transmit one signal among the input signals as a first transmission signal using a plurality of first type pass transistors;
a second path circuit configured to transmit one signal among the input signals as a second transmission signal using a plurality of second type pass transistors; and
an output circuit configured to output one of two voltages as the output signal in response to the first transmission signal and the second transmission signal.

32. The semiconductor device of claim 31, wherein the first path circuit comprises:
a plurality of first type first stage multiplexers, each comprising some of the plurality of first type pass transistors, each of the first type first stage multiplexer outputting one signal among some of the input signals in response to a plurality of first control signals; and
a first type second stage multiplexer comprising the rest of the plurality of first type pass transistors connected with the plurality of first type first stage multiplexers, the first type second stage multiplexer outputting one signal among signals output from the plurality of first type first stage multiplexers as the first transmission signal in response to a plurality of second control signals.

33. The semiconductor device of claim 31, wherein the second path circuit comprises:
a plurality of second type first stage multiplexers each comprising some of the plurality of second type pass transistors, each of the second type first stage multiplexers outputting one signal among some of the input signals in response to a plurality of first control signals; and
a second type second stage multiplexer comprising the rest of the plurality of second type pass transistors connected with the plurality of second type first stage multiplexers, the second type second stage multiplexer outputting one signal among signals output from the plurality of second type first stage multiplexers as the second transmission signal in response to a plurality of second control signals.

34. The semiconductor device of claim 31, wherein the output circuit comprises:
a second type transistor configured to output one of the two voltages as the output signal in response to the first transmission signal; and
a first type transistor configured to output the other one of the two voltages as the output signal in response to the second transmission signal.

35. An electronic device comprising:
a semiconductor device; and
a processor configured to control an operation of the semiconductor device,
wherein the semiconductor device comprises:
a data input circuit configured to output a plurality of input signals output from the processor; and
a multiplexer configured to output one signal among the input signals as an output signal, the multiplexer comprising a first path circuit configured to transmit one signal among the input signals as a first transmission signal using a plurality of first type pass transistors, a second path circuit configured to transmit one signal among the input signals as a second transmission signal using a plurality of second type pass transistors, and an output circuit configured to output one of two voltages as the output signal in response to the first transmission signal and the second transmission signal.

36. The electronic device of claim 35, wherein the first path circuit comprises:
a plurality of first type first stage multiplexers each comprising some of the plurality of first type pass transistors, each of the first type first stage multiplexer outputting one signal among some of the input signals in response to a plurality of first control signals; and
a first type second stage multiplexer comprising the rest of the plurality of first type pass transistors connected with the plurality of first type first stage multiplexers, the first type second stage multiplexer outputting one signal among signals output from the plurality of first type first stage multiplexers as the first transmission signal in response to a plurality of second control signals.

37. The electronic device of claim 35, wherein the second path circuit comprises:
a plurality of second type first stage multiplexers, each comprising some of the plurality of second type pass transistors, each of the second type first stage multiplexers outputting one signal among some of the input signals in response to a plurality of first control signals; and
a second type second stage multiplexer comprising the rest of the plurality of second type pass transistors connected with the plurality of second type first stage multiplexers, the second type second stage multiplexer outputting one signal among signals output from the plurality of second type first stage multiplexers as the second transmission signal in response to a plurality of second control signals.

38. The electronic device of claim 35, wherein the output circuit comprises:
a second type transistor configured to output one of the two voltages as the output signal in response to the first transmission signal; and
a first type transistor configured to output the other one of the two voltages as the output signal in response to the second transmission signal.

* * * * *